United States Patent
Eaton et al.

(10) Patent No.: US 6,552,410 B1
(45) Date of Patent: Apr. 22, 2003

(54) PROGRAMMABLE ANTIFUSE INTERFACING A PROGRAMMABLE LOGIC AND A DEDICATED DEVICE

(75) Inventors: David D. Eaton, San Jose, CA (US); Ket-Chong Yap, Fremont, CA (US); Kevin K. Yee, San Jose, CA (US); E. Thomas Hart, Los Altos Hills, CA (US); Andrew K. Chan, Palo Alto, CA (US); Neal A. Palmer, La Jolla, CA (US); Michael W. Dini, La Jolla, CA (US); James Apland, Gilroy, CA (US); Panawalge S. N. Gunaratna, Campbell, CA (US)

(73) Assignee: QuickLogic Corporation, Sunnyvale, CA (US)

( * ) Notice: Subject to any disclaimer, the term of this patent is extended or adjusted under 35 U.S.C. 154(b) by 0 days.

(21) Appl. No.: 09/650,773

(22) Filed: Aug. 29, 2000

Related U.S. Application Data

(60) Provisional application No. 60/151,673, filed on Aug. 31, 1999.

(51) Int. Cl.$^7$ ............................................... H01L 22/00
(52) U.S. Cl. ...................... 257/530; 257/295; 257/296; 257/297; 257/298; 257/299; 257/529
(58) Field of Search ................................. 257/295–306

(56) References Cited

U.S. PATENT DOCUMENTS

| | | | |
|---|---|---|---|
| 5,237,218 A | 8/1993 | Josephson et al. | 307/465 |
| 5,587,669 A | 12/1996 | Chan et al. | 326/38 |
| 5,687,325 A | 11/1997 | Chang | 395/284 |
| 5,698,992 A | 12/1997 | El Ayat et al. | 326/41 |
| 5,825,200 A | 10/1998 | Kolze | 326/38 |
| 5,892,684 A | 4/1999 | Chua | 364/488 |
| 5,898,776 A | 4/1999 | Apland et al. | 380/3 |
| 6,018,251 A * | 6/2000 | Kolze | 326/41 |
| 6,246,258 B1 * | 6/2001 | Lesea | 326/71 |

FOREIGN PATENT DOCUMENTS

| | | | |
|---|---|---|---|
| WO | WO 98/38741 | 9/1998 | H03K/19/177 |

OTHER PUBLICATIONS

Bursky: Improved Array Efficiency Lets FPGAs Challenge Gate Arrays Electronic Design, US, Penton Publishing, Cleveland, OH, vol. 43, No. 18, Sep. 5, 1995, pp. 91–92, 96–97, XP000535279, ISSN: 0013–4872.

El-Ayat et al: "A CMOS Electrically Configurable Gate Array" IEEE Journal of Solid–State Circuits, US, IEEE Inc. New York, vol. 24, No. 3, Jun. 1, 1989, pp. 752–762, XP000035175, ISSN: 0018–9200.

* cited by examiner

*Primary Examiner*—Fetsum Abraham
(74) *Attorney, Agent, or Firm*—Skjerven Morrill LLP

(57) ABSTRACT

A programmable circuit, such as a field programmable gate array, and a dedicated device, such as an ASIC type device, are coupled together with an antifuse based interface on a single integrated circuit. A configurable non-volatile memory that communicates with the dedicated device is also located on the integrated circuit. The platform for the programmable circuit is one half of an existing programmable circuit, which eliminates the need to engineer the programmable circuit. The programmable circuit includes a clock network that receives clock signals from clock terminals as well as from a clock network in the dedicated device. The interface between the dedicated device and programmable circuit includes a number of conductors with buffers with testing circuitry. The testing circuitry includes a PMOS test transistor and a NMOS test transistor which permits testing of the buffers without programming the antifuses coupled to the conductors. The input/output terminals around the periphery and in the interface between the programmable circuit and dedicated device are tested using JTAG registers. The path of the test signal through the JTAG registers is selectable to pass around the periphery of both the programmable and dedicated devices or through the interface and around the periphery of only one of the programmable and dedicated devices.

13 Claims, 42 Drawing Sheets

FIG. 2B1
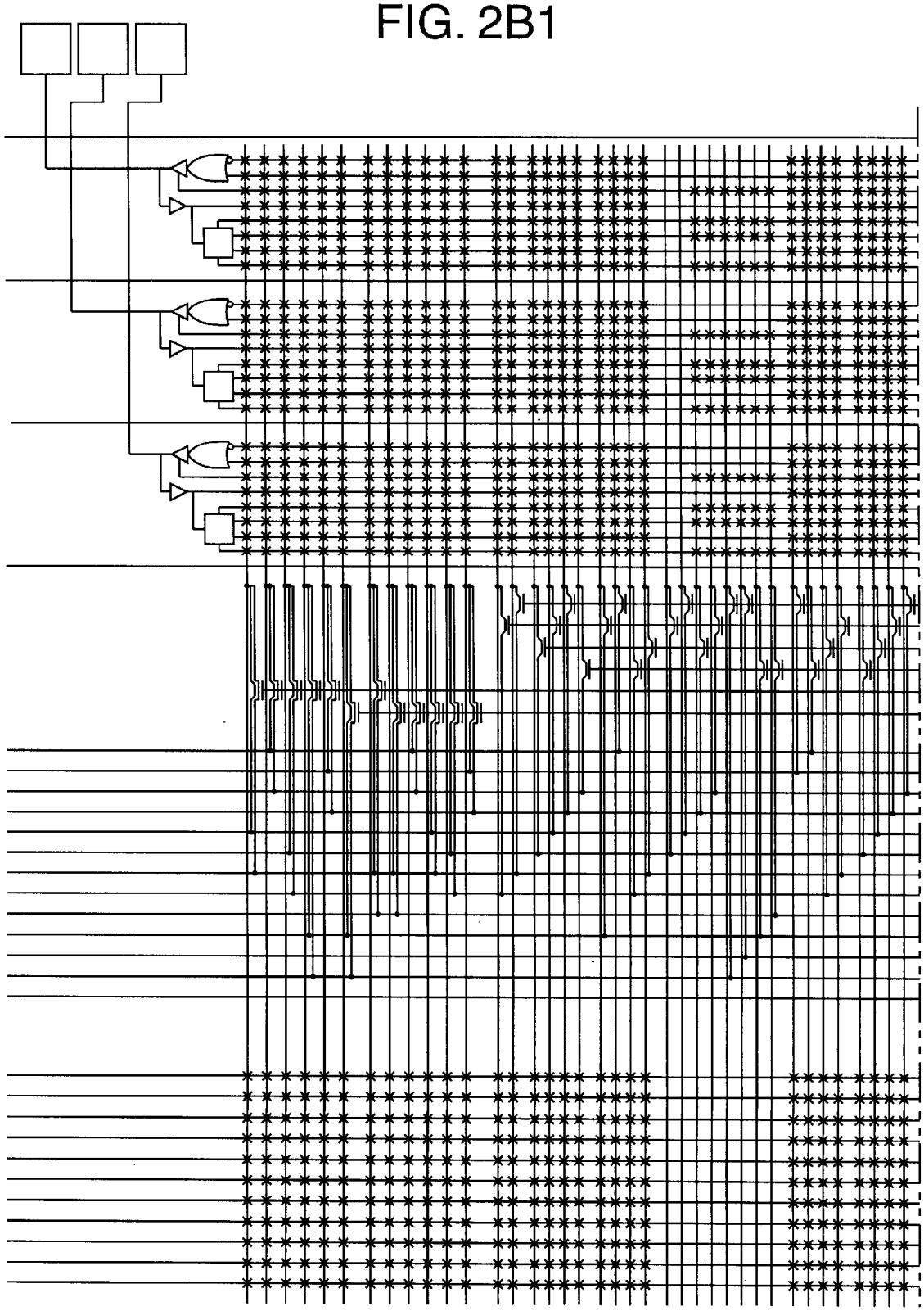

FIG. 2B2
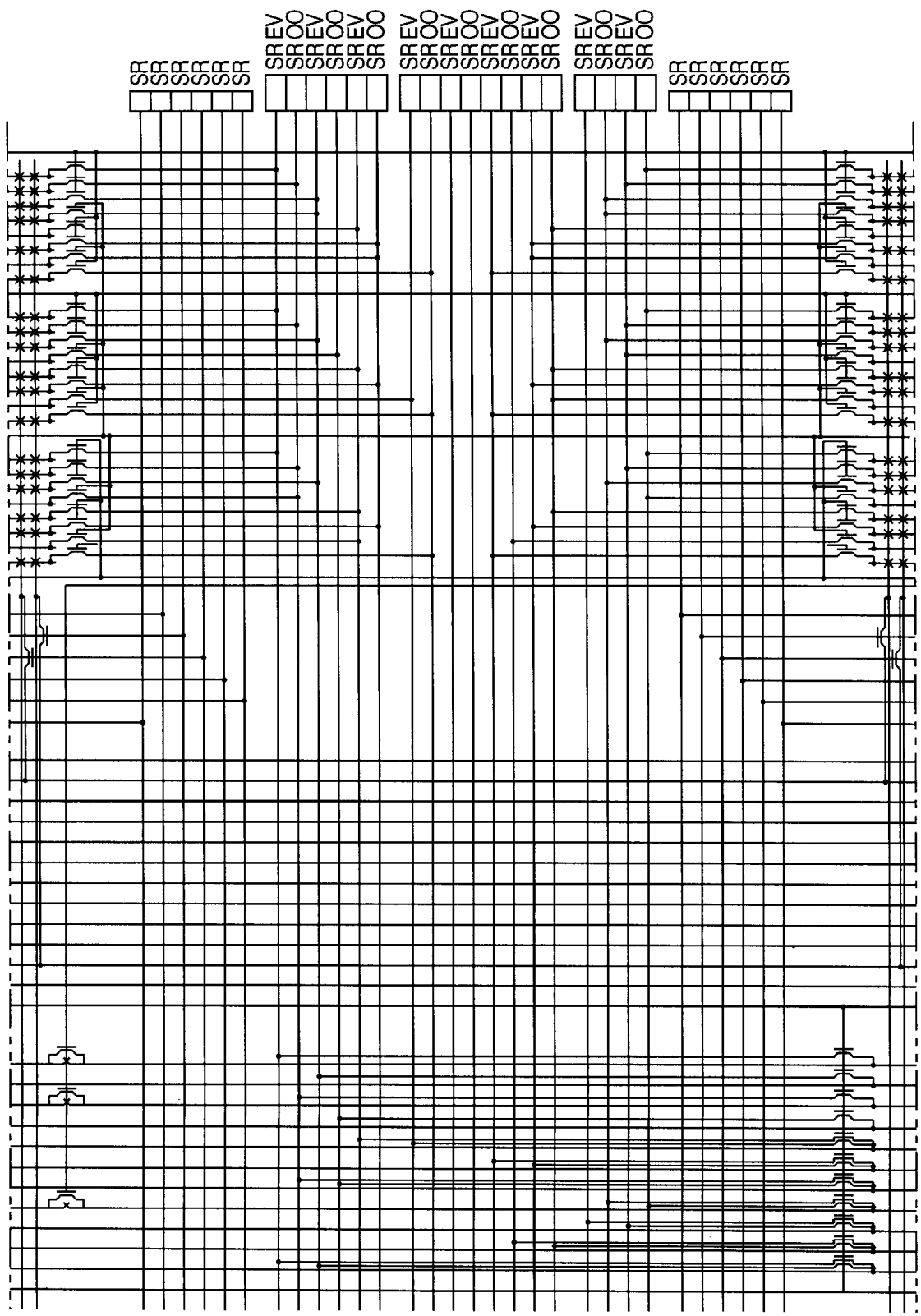

FIG. 2B3

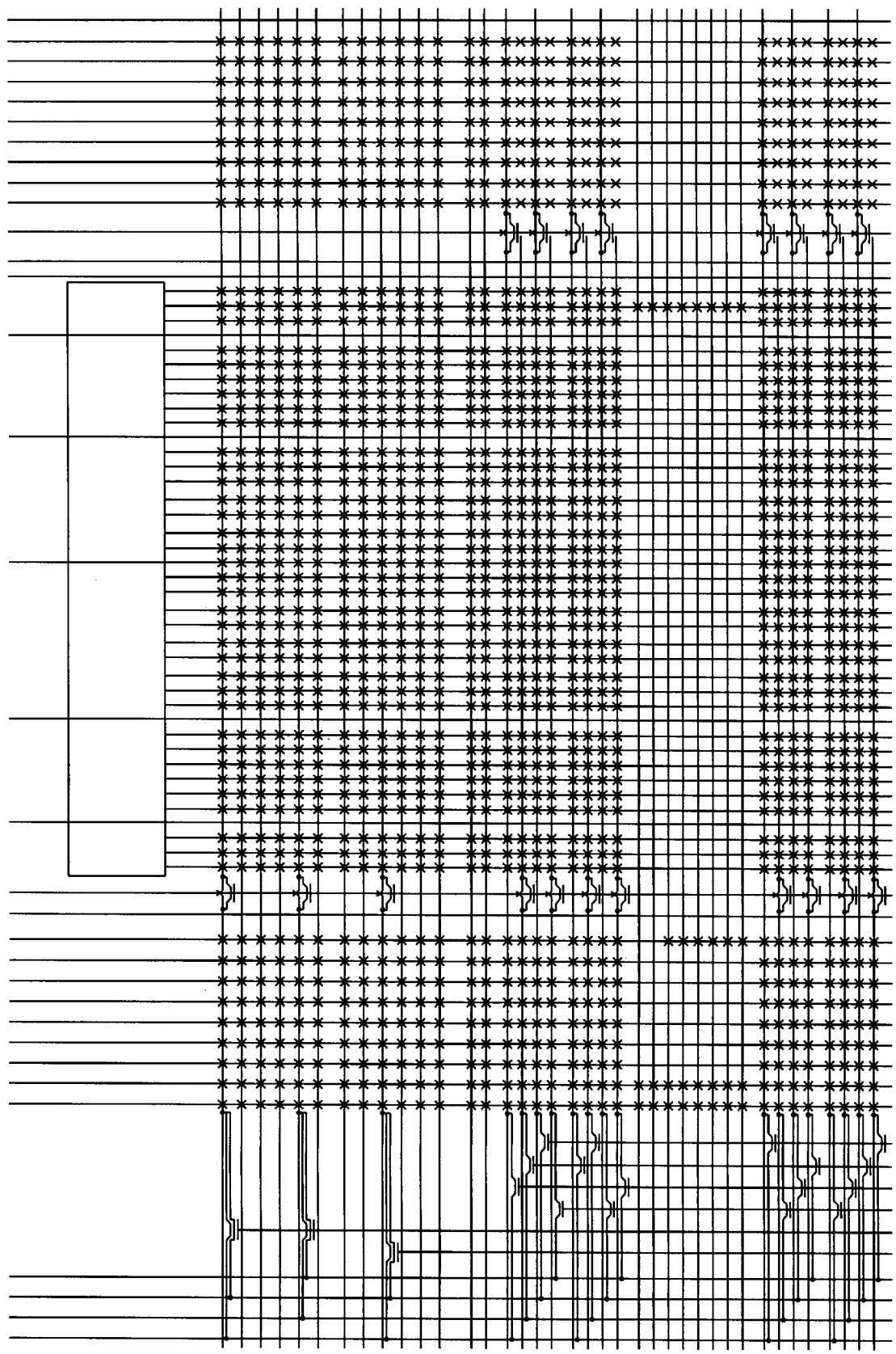
FIG. 2F1

FIG. 2F2
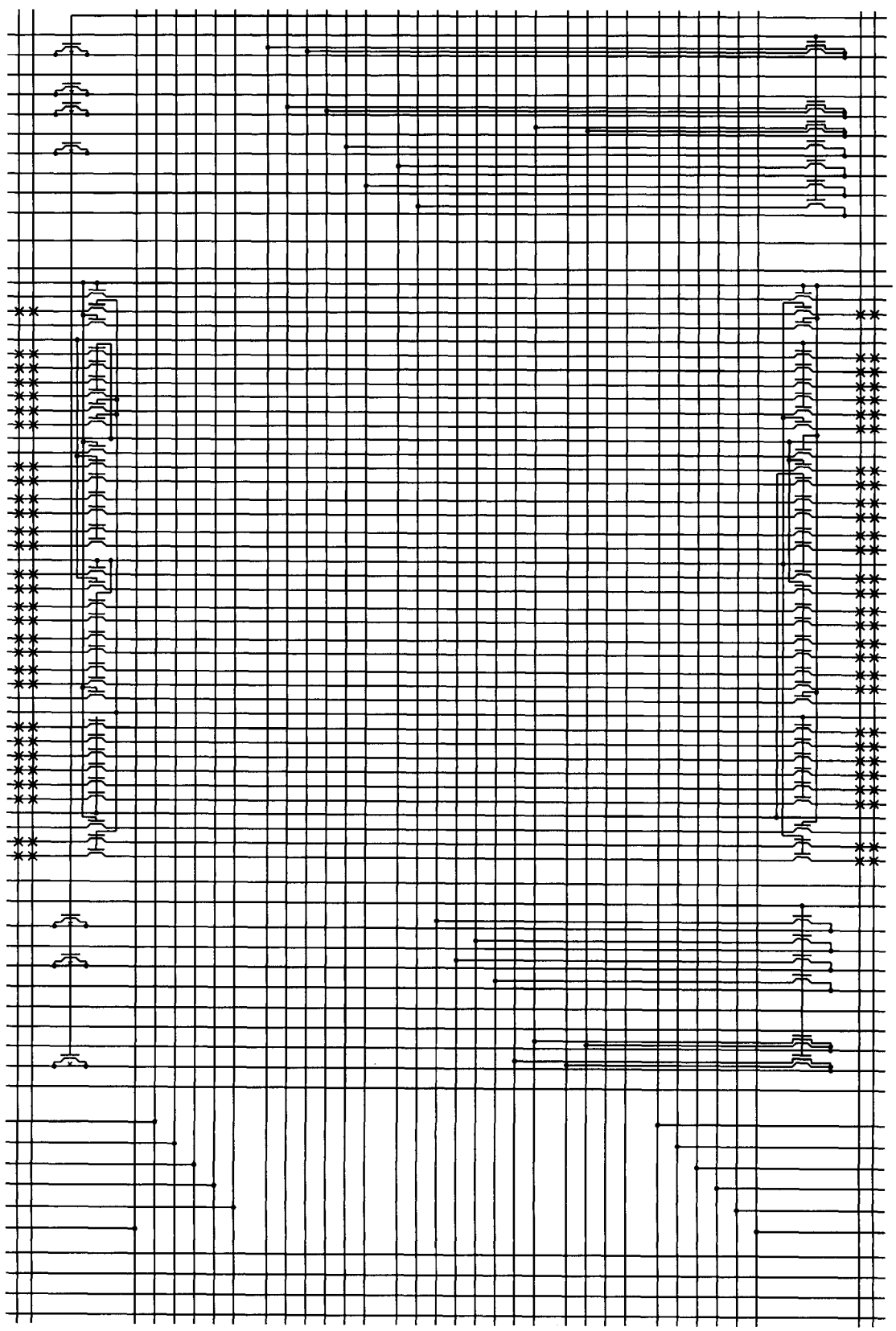

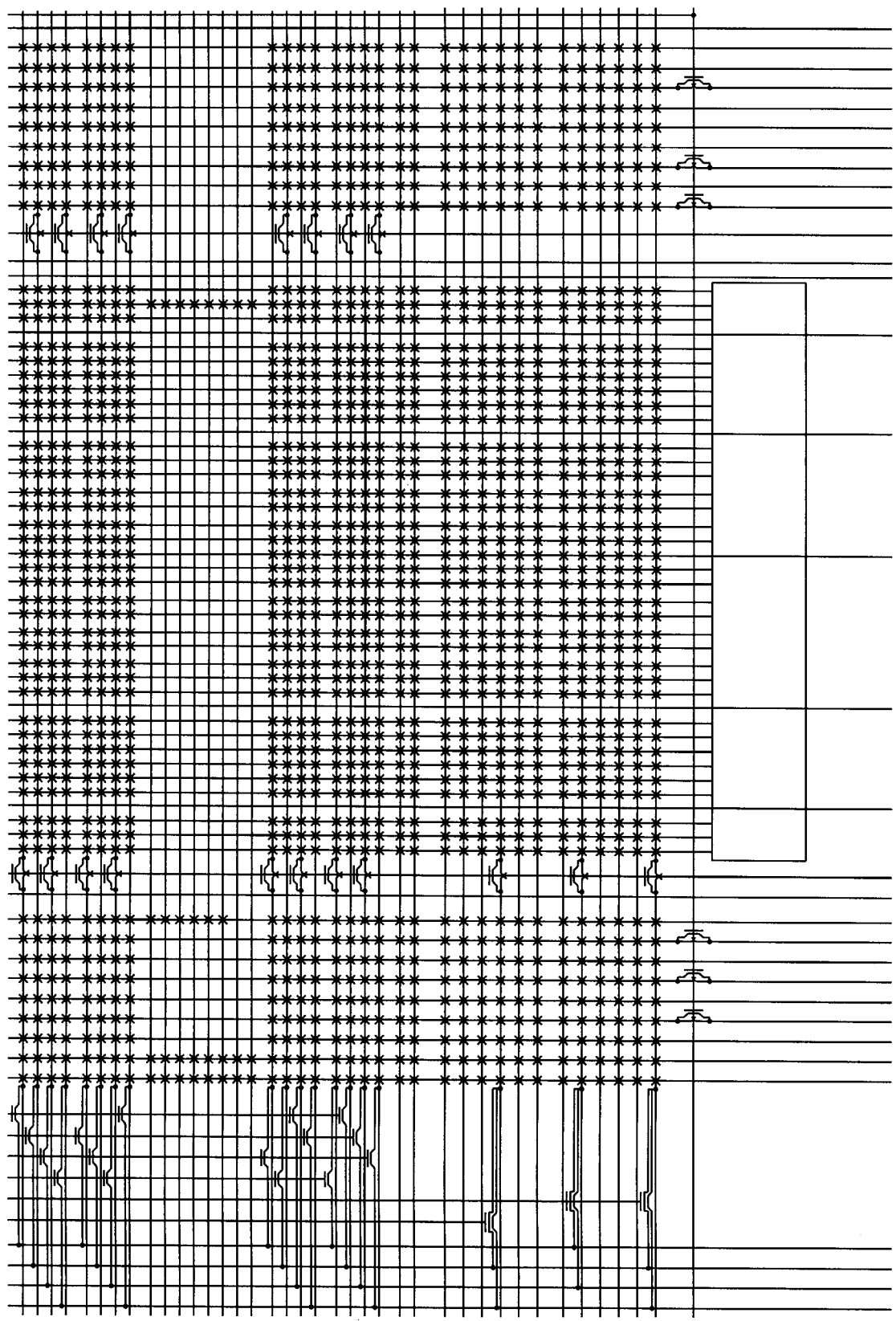
FIG. 2F3   FIG. 2F

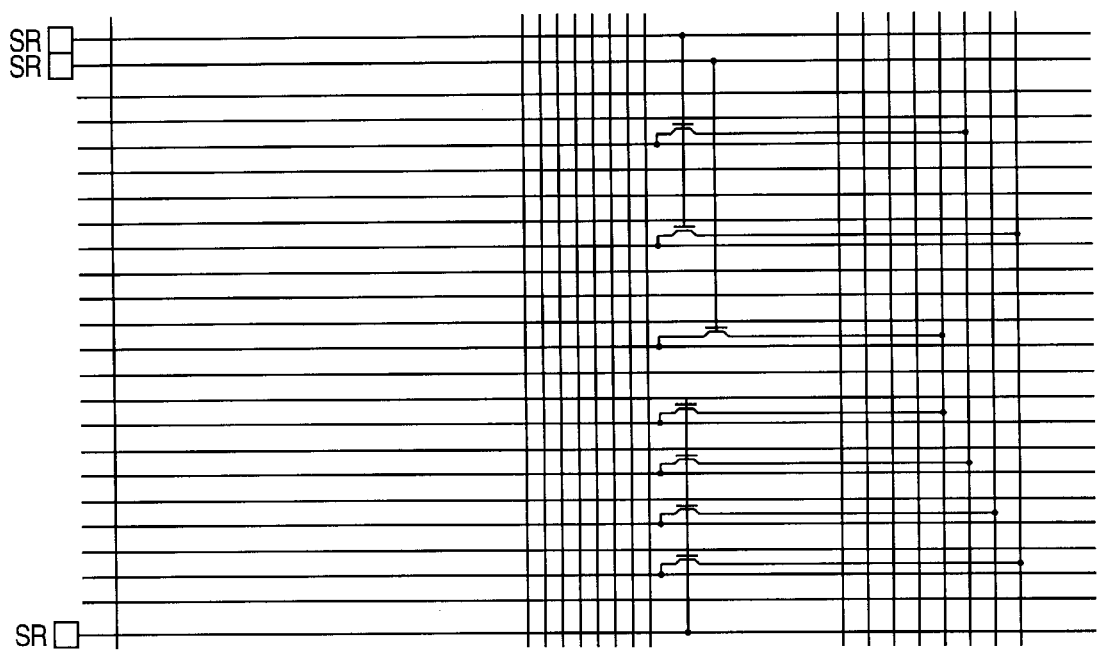
FIG. 2I
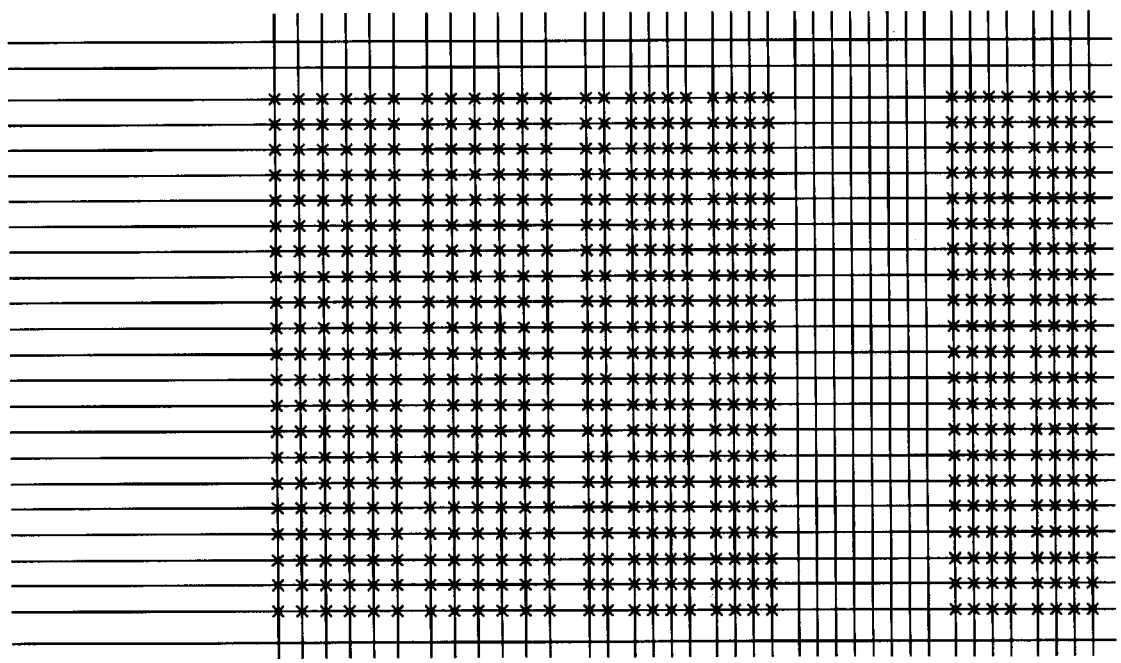
FIG. 2J1

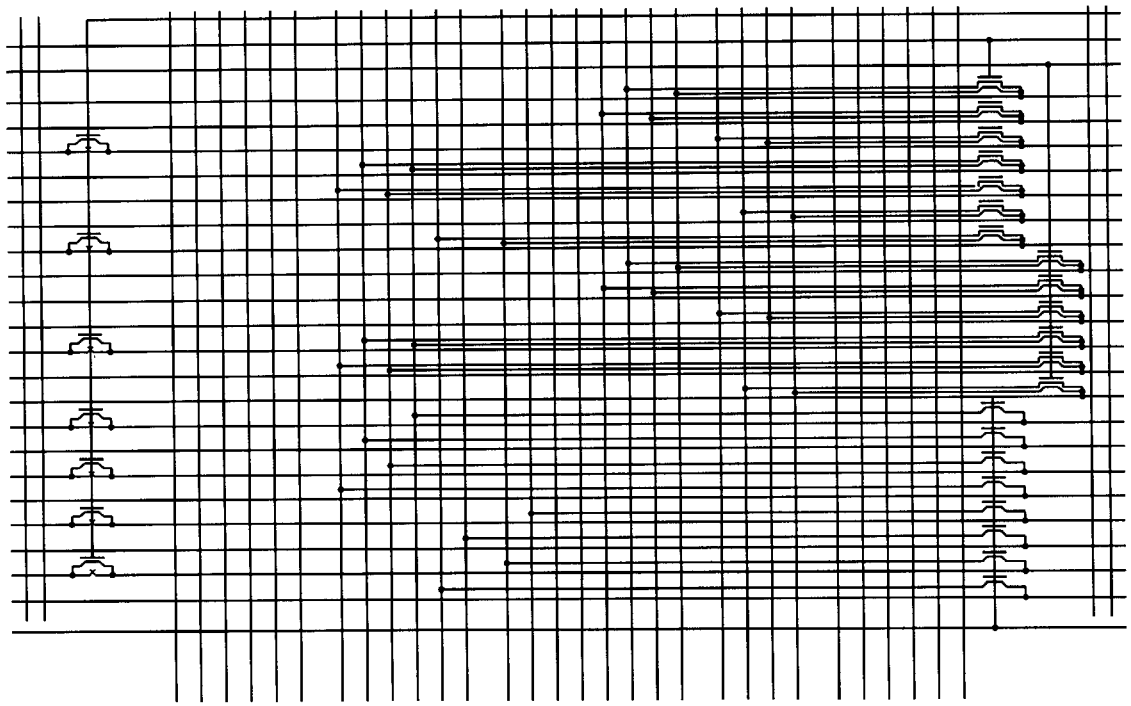
FIG. 2J2
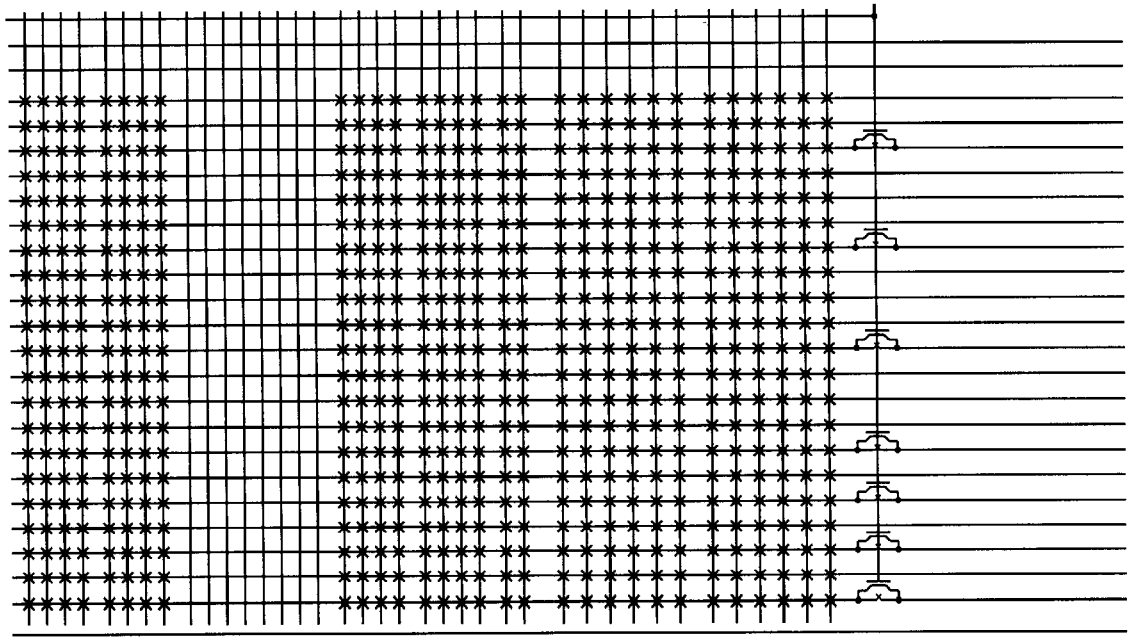
FIG. 2J3
FIG. 2J | FIG. 2J1 | FIG. 2J2 | FIG. 2J3

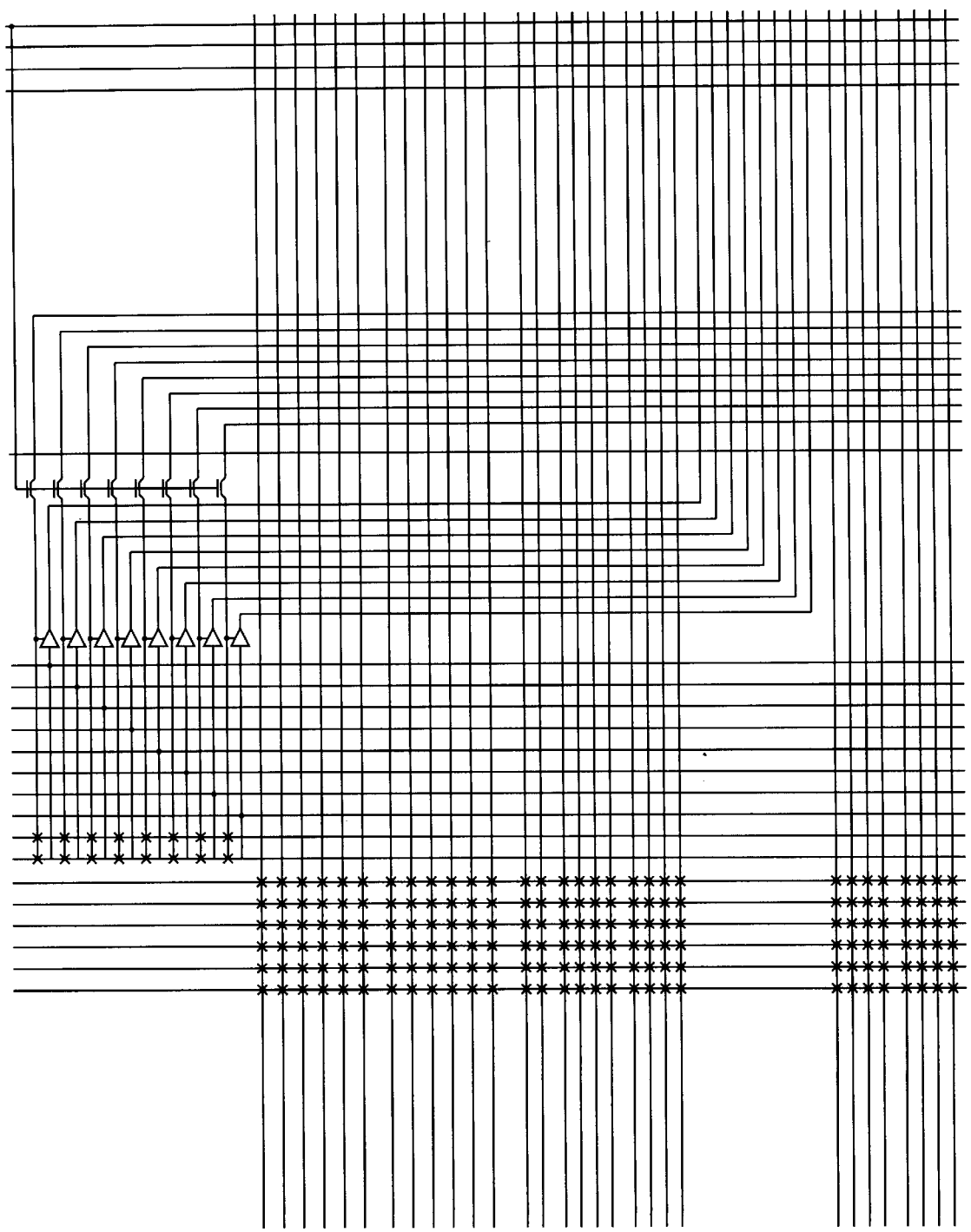
FIG. 2N1

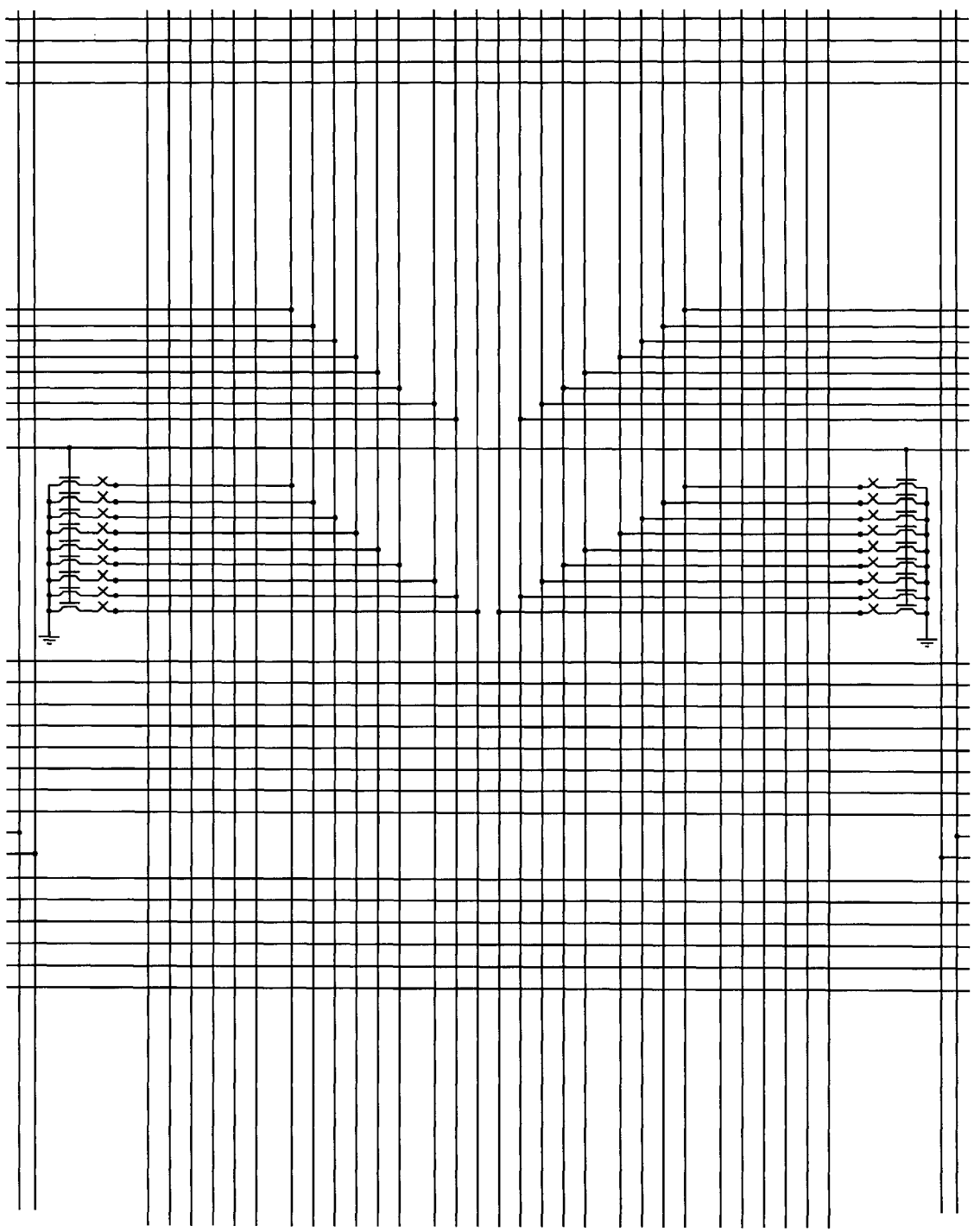
FIG. 2N2

FIG. 2N3

| FIG. 2N1 | FIG. 2N2 | FIG. 2N3 |

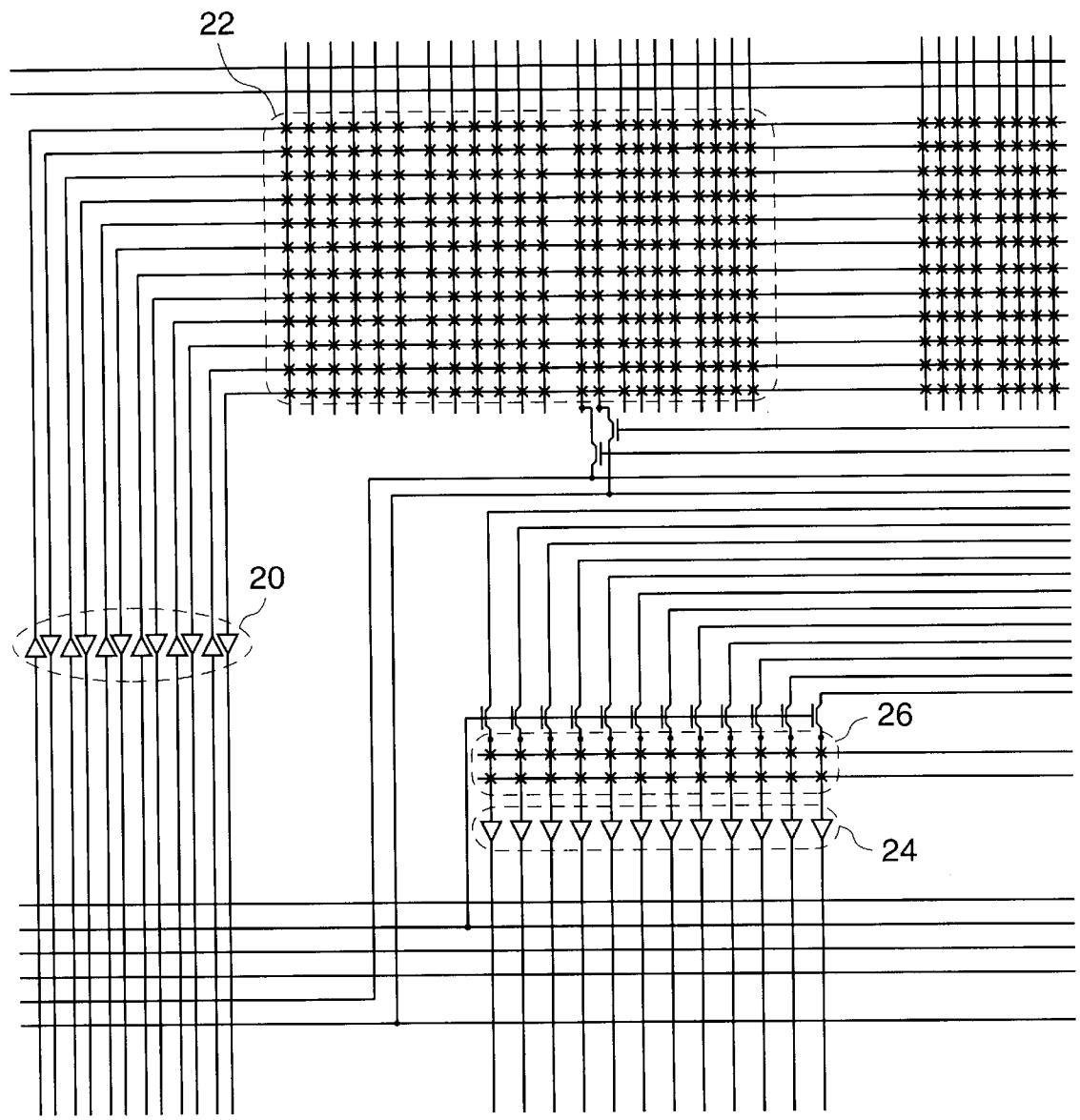
FIG. 2R1

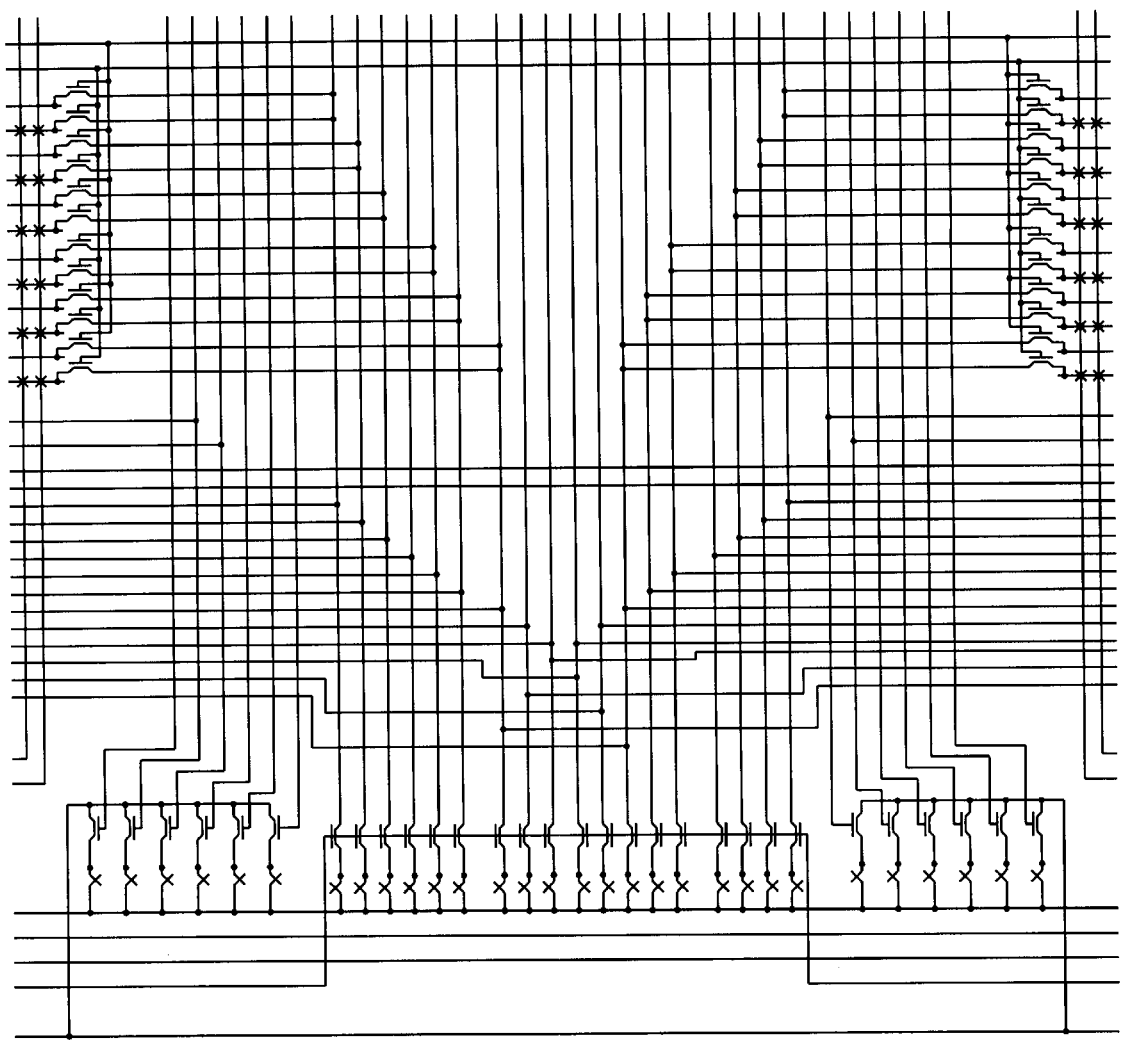
FIG. 2R2

FIG. 2R3

| FIG. 2R1 | FIG. 2R2 | FIG. 2R3 |

PROGRAMMABLE ANTIFUSE INTERFACING A PROGRAMMABLE LOGIC AND A DEDICATED DEVICE

CROSS-REFERENCE TO RELATED APPLICATIONS

This application claims the benefit of U.S. Provisional Application No. 60/151,673, filed on Aug. 31, 1999.

FIELD OF THE INVENTION

The present invention relates to an integrated circuit that includes programmable logic such as a field programmable gate array, dedicated logic such as an ASIC type device, and an interface for communication between the programmable and dedicated devices.

BACKGROUND

The semiconductor industry is driven with a desire to provide higher levels of integration. With higher levels of integration, silicon space and cost are reduced while performance and reliability are increased. Unfortunately, higher levels of integration lead to greater specificity. For example, application specific integrated circuits (ASICs) are highly specific devices that often serve the needs of only one customer.

Programmable logic devices, such as field programmable gate arrays (FPGAs) are versatile integrated circuit chips, which have internal circuitry logic with user selected connections that a user can configure to realize user-specific functions. While programmable logic is versatile, there are significant design challenges in size, routing, pin-out stability when mapping large complex functions onto a silicon platform containing programmable logic.

While programmable logic devices may be linked with separate dedicated devices, there are associated on/off chip delays, large board area, and high cost. Further, while programming a programmable logic to perform the desired function is possible, this is an expensive proposition and the resulting performance is often not acceptable.

Consequently, what is needed is a single integrated device that combines the flexibility of programmable logic with the performance and reliability of a dedicated device.

SUMMARY

Programmable logic, such as a field programmable gate array, and a dedicated device, such as an ASIC type device, are coupled together with an antifuse based interface on a single integrated circuit. A configurable non-volatile memory that uses the technology of the programmable logic provides a convenient on-chip configuration of or parameter setting for the dedicated device. In one embodiment, the platform for the programmable logic is one half of an existing programmable logic device, which advantageously eliminates the need to engineer the programmable logic. The dedicated device can implement a complex but often required functions such as a bus interface for an industry standard bus, while the programmable circuit permits the user to implement custom functionality. Placing both the dedicated device and the programmable logic on the same chip allows a high throughput between the circuits but does not require a larger number of I/O pins because the communication is internal to the integrated circuit chip.

The programmable logic can include a clock network that receives clock signals from input/output terminals as well as from a clock network in the dedicated device. Accordingly, the programmable logic can operate at a frequency independent of the dedicated circuit. Input/output clock terminals for the programmable logic are generally on a side of the chip closest to the programmable logic, while the input/output clock terminals for the dedicated device are on the opposite side of the chip closest to the dedicated device. The clock network distributes the clock signals to both the programmable logic and the dedicated device.

The interface between the dedicated device and programmable logic includes a number of conductors having buffers and testing circuitry. The testing circuitry includes a PMOS test transistor and an NMOS test transistor which have their gates coupled to the output terminals of the buffers. The PMOS test transistor is coupled between a voltage source and an output terminal, while the NMOS test transistor is coupled between a ground source and a different output terminal. The output terminal of the PMOS test transistor is coupled to the output terminal of an inverter. During test mode, the inverter is tied to a voltage source. The PMOS test transistor is larger than the NMOS transistor in the inverter. Thus, when the PMOS test transistor is off the inverter drives the output terminal low, but when the PMOS test transistor is on the PMOS test transistor drives the output terminal high. The output terminal of the NMOS test transistor is coupled to the output terminal of another inverter, which is tied to a ground source during testing. The NMOS test transistor is larger than the PMOS transistor in the inverter. The testing circuitry advantageously permits testing of the buffers without programming the antifuses coupled to the conductors.

In accordance with another embodiment of the present invention, the input/output terminals around the periphery and in the interface between the programmable logic and dedicated device are tested using JTAG registers. The path of the test signal through the JTAG registers is selectable to pass around the periphery of both the programmable logic and the dedicated device or through the interface and around the periphery of the dedicated device.

BRIEF DESCRIPTION OF THE DRAWINGS

Use of the same reference symbols in different figures indicates similar or identical items.

DETAILED DESCRIPTION

Figures 1, 2:
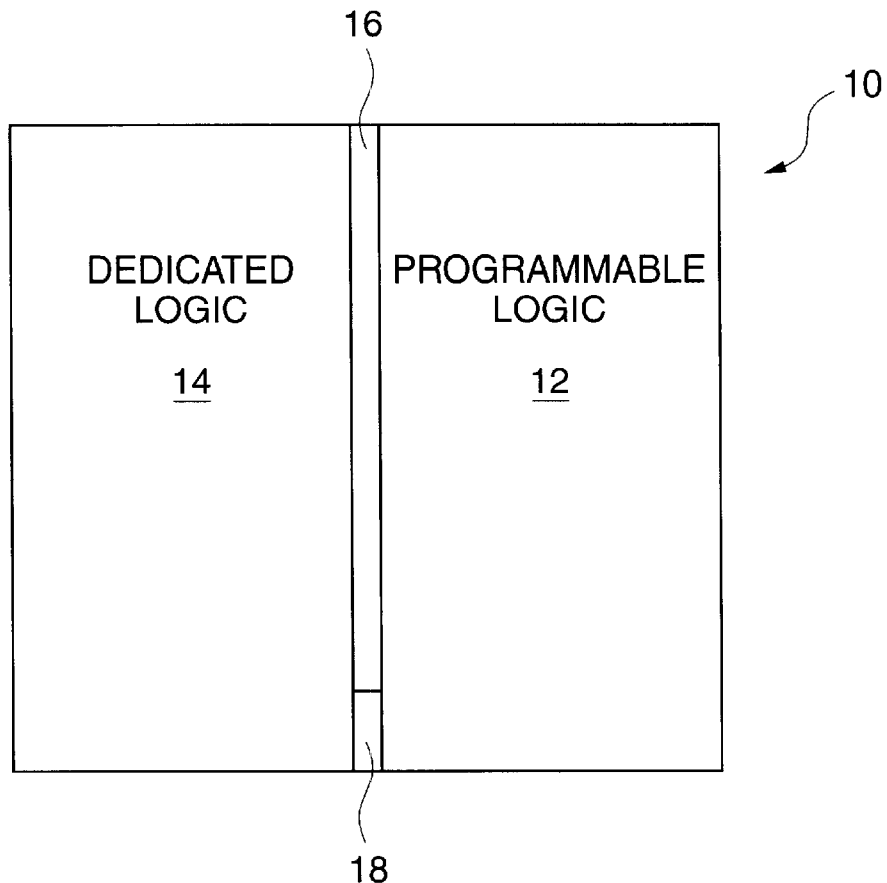
FIG. 1 is a schematic view of an integrated circuit that in accordance with an embodiment of the present invention includes programmable logic, a dedicated device, and an interface between the two.
FIG. 2 is a diagram showing how FIGS. 2A, 2B (which includes 2B1, 2B2, 2B3), 2C, 2D, 2E, 2F (which includes 2F1, 2F2, 2F3), 2G, 2H, 2I, 2J1, 2J2, 2J3, 2K, 2L, 2M, 2N (which includes 2N1, 2N2, 2N3), 2O, 2P, 2Q, 2R (which includes 2R1, 2R2, 2R3), 2S, 2T fit together to form one large simplified schematic of one embodiment of programmable logic and part of an interface employing antifuses.

FIG. 1 is a schematic view of an integrated circuit 10 in accordance with an embodiment of the present invention. Integrated circuit 10 includes programmable logic 12 and dedicated logic 14, each of which has I/O pins for connection to external circuitry. An interface 16 connects programmable logic 12 to dedicated logic 14. Integrated circuit 10 may be thought of as a programmable logic device with dedicated logic 14 "embedded" onto the same piece of silicon, or vice versa, i.e., a dedicated device with "embedded" programmable logic 12. Programmable logic 12 is, for example, a field programmable gate array (FPGA) or other circuitry having user programmable circuit connections, while dedicated logic 14 is a fixed circuit implementing a desired function. For example, dedicated logic 14 may be an application specific circuit that performs a function such as creating an interface with an industry standard bus.

FIG. 1 also shows a programmable read only memory (PROM) 18. PROM 18 stores data that configures or sets parameters for dedicated logic 14 and can be implemented using the technology of programmable logic 12. Alternatively, PROM 18 can be replaced with an external or internal EEPROM that serves the same purpose.

Advantageously, integrated circuit 10, with connected programmable logic 12 and dedicated logic 14, provides a user with the guaranteed functionality, ease-of-use, and high performance found in a dedicated device, such as an ASIC, as well as the configurability and flexibility found in programmable logic, such as FPGAs.

Figure 2A:
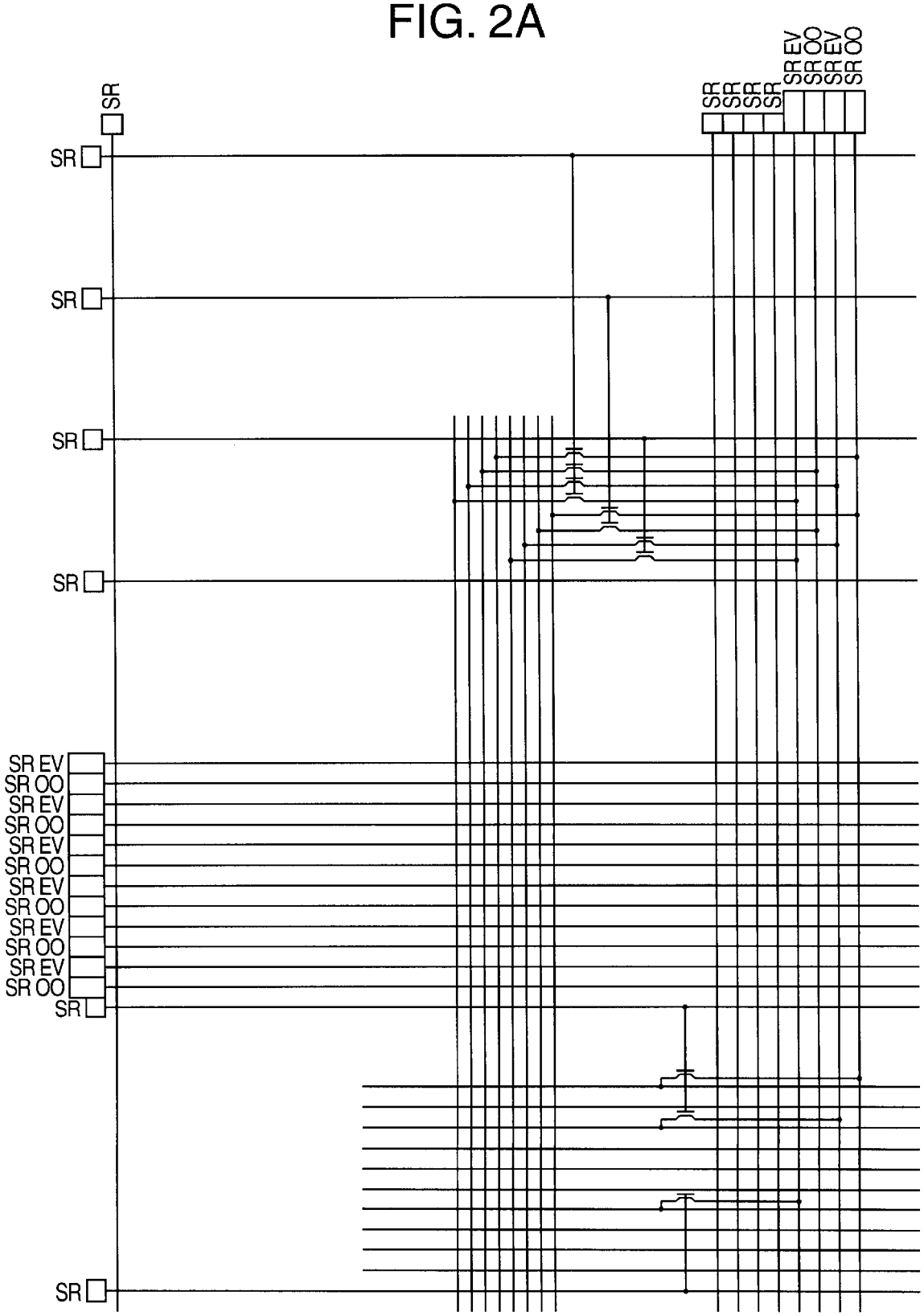
Figure 2B:
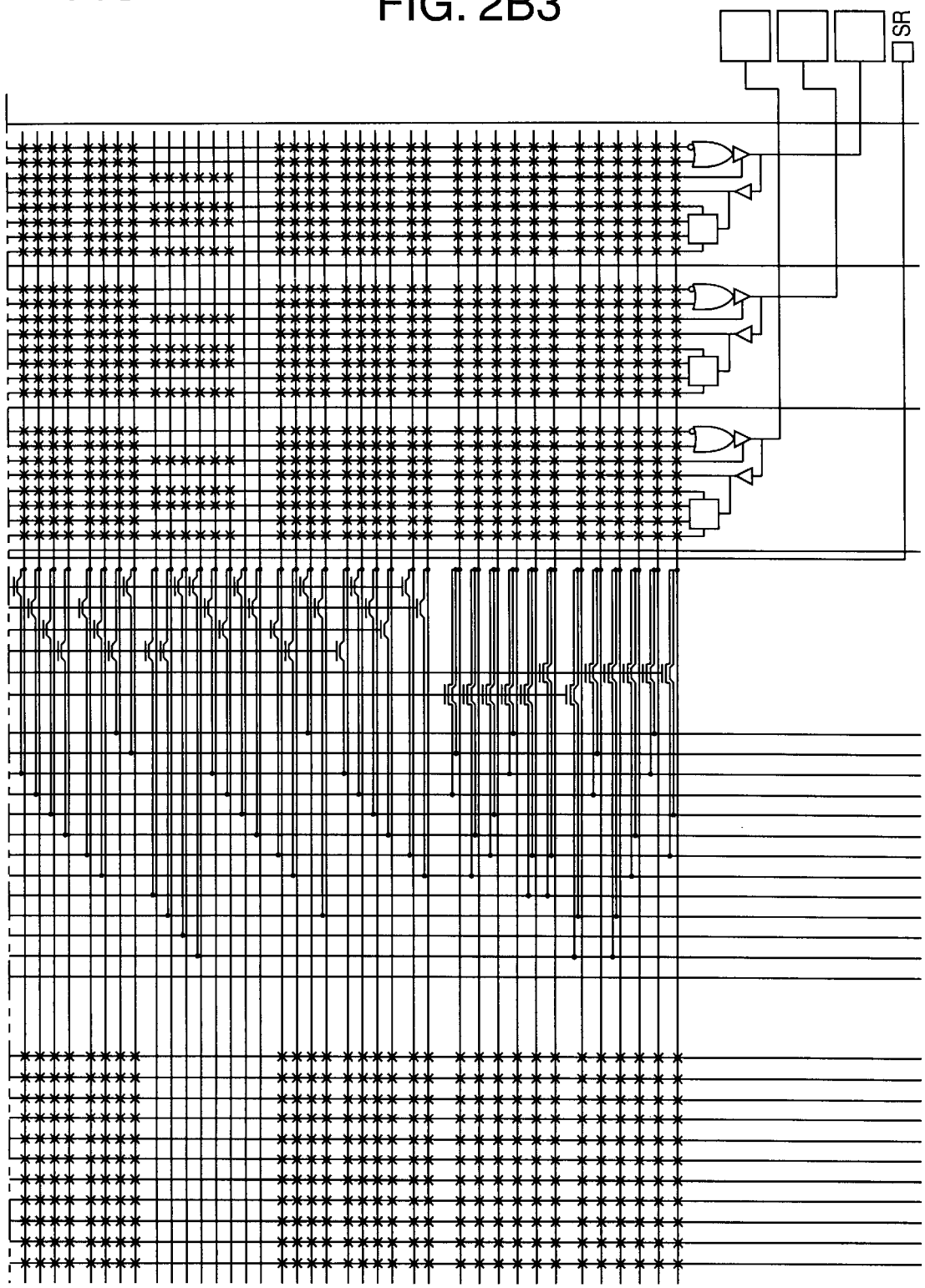

FIG. 2 is a diagram showing how FIGS. 2A, 2B (which includes 2B1, 2B2, 2B3), 2C, 2D, 2E, 2F (which includes 2F1, 2F2, 2F3), 2G, 2H, 2I, 2J1, 2J2, 2J3, 2K, 2L, 2M, 2N (which includes 2N1, 2N2, 2N3), 2O, 2P, 2Q, 2R (which includes 2R1, 2R2, 2R3), 2S, 2T fit together to form one large simplified schematic of one embodiment of programmable logic 12 and part of interface 16. The boxes of FIG. 2 each have a letter to indicated one of the FIGS. 2A–2T.

The "A" in the upper left hand box, for example, indicates FIG. 2A. As is seen from FIG. 2, the structure of FIG. 2A borders 2B on the right and the structure of FIG. 2E on the bottom.

Figure 2C:
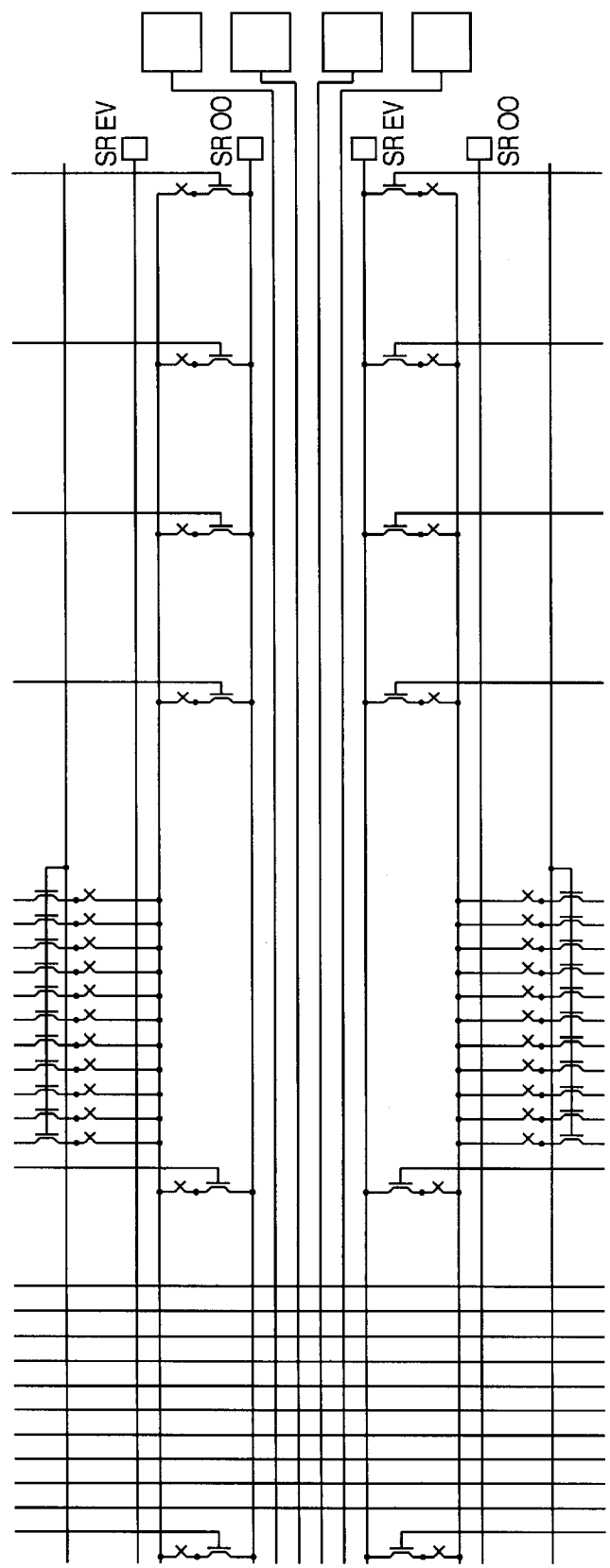
Figure 2D:
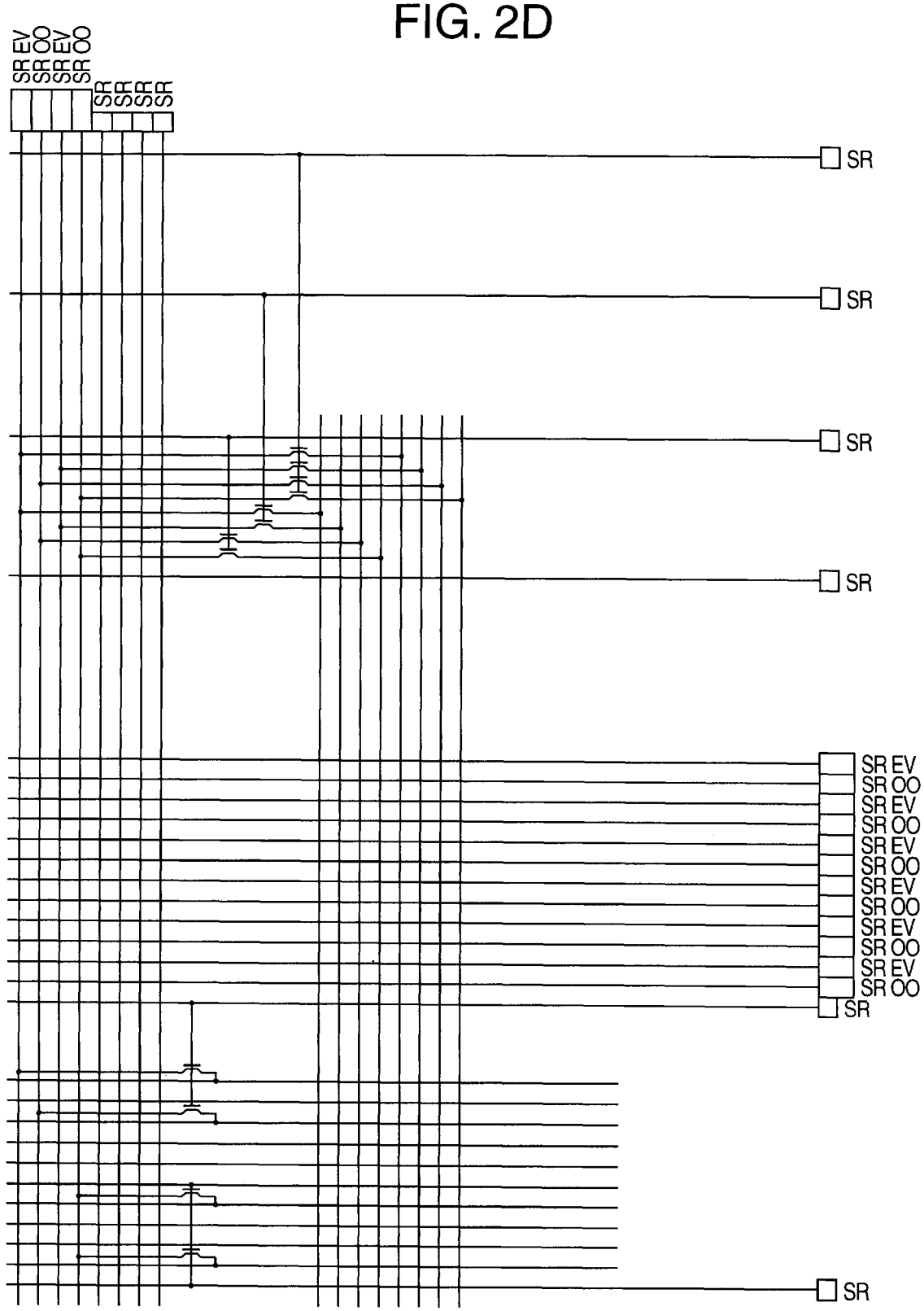
Figure 2E:
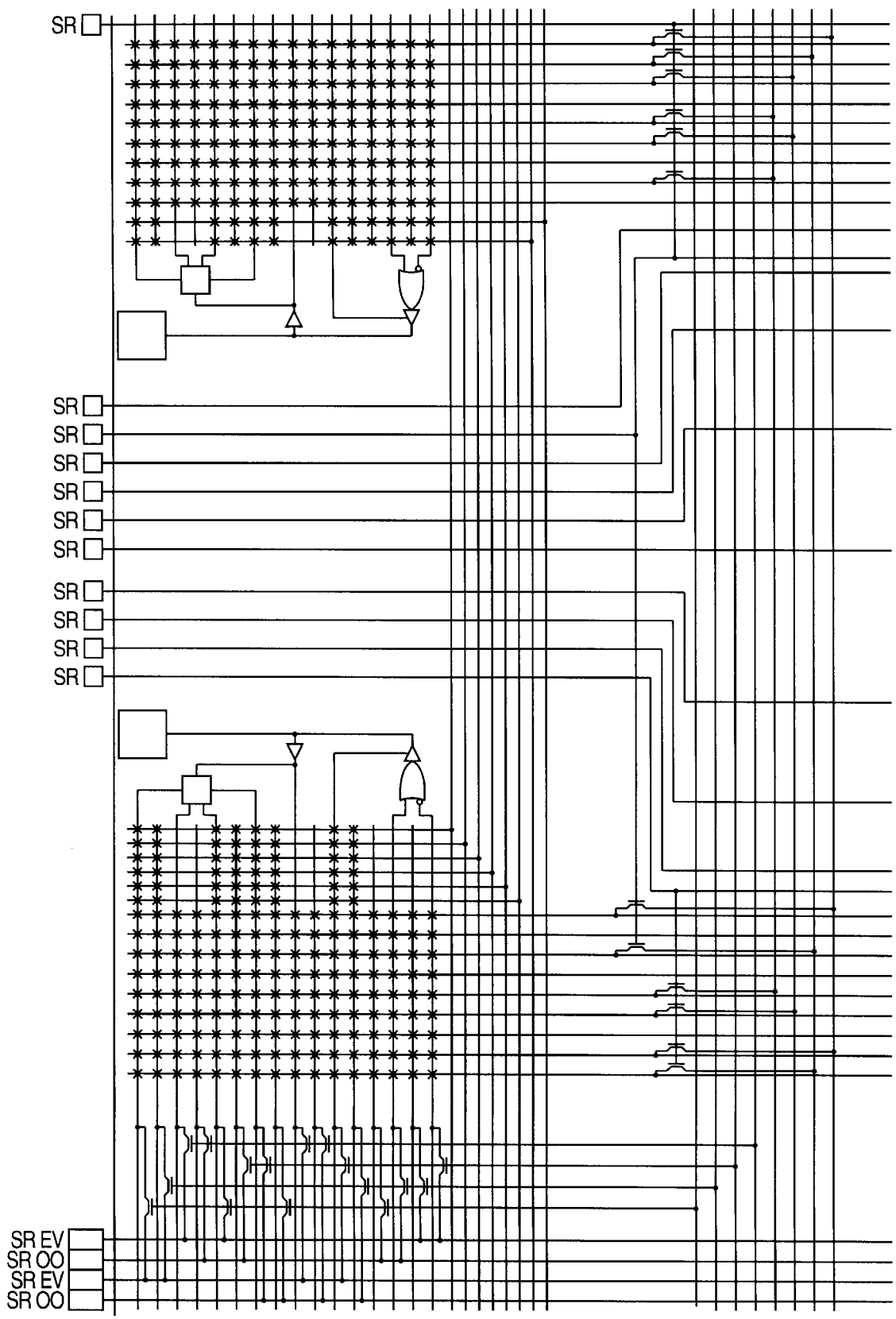
Figure 2G:
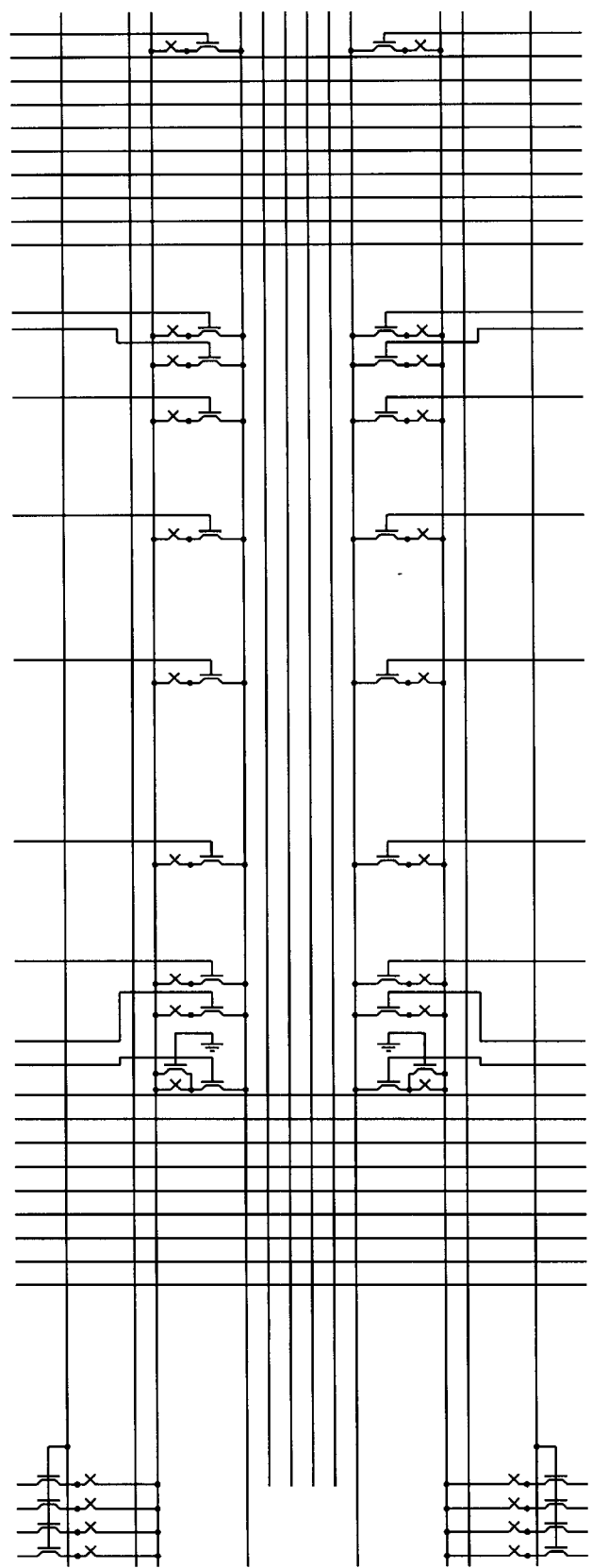
Figure 2H:
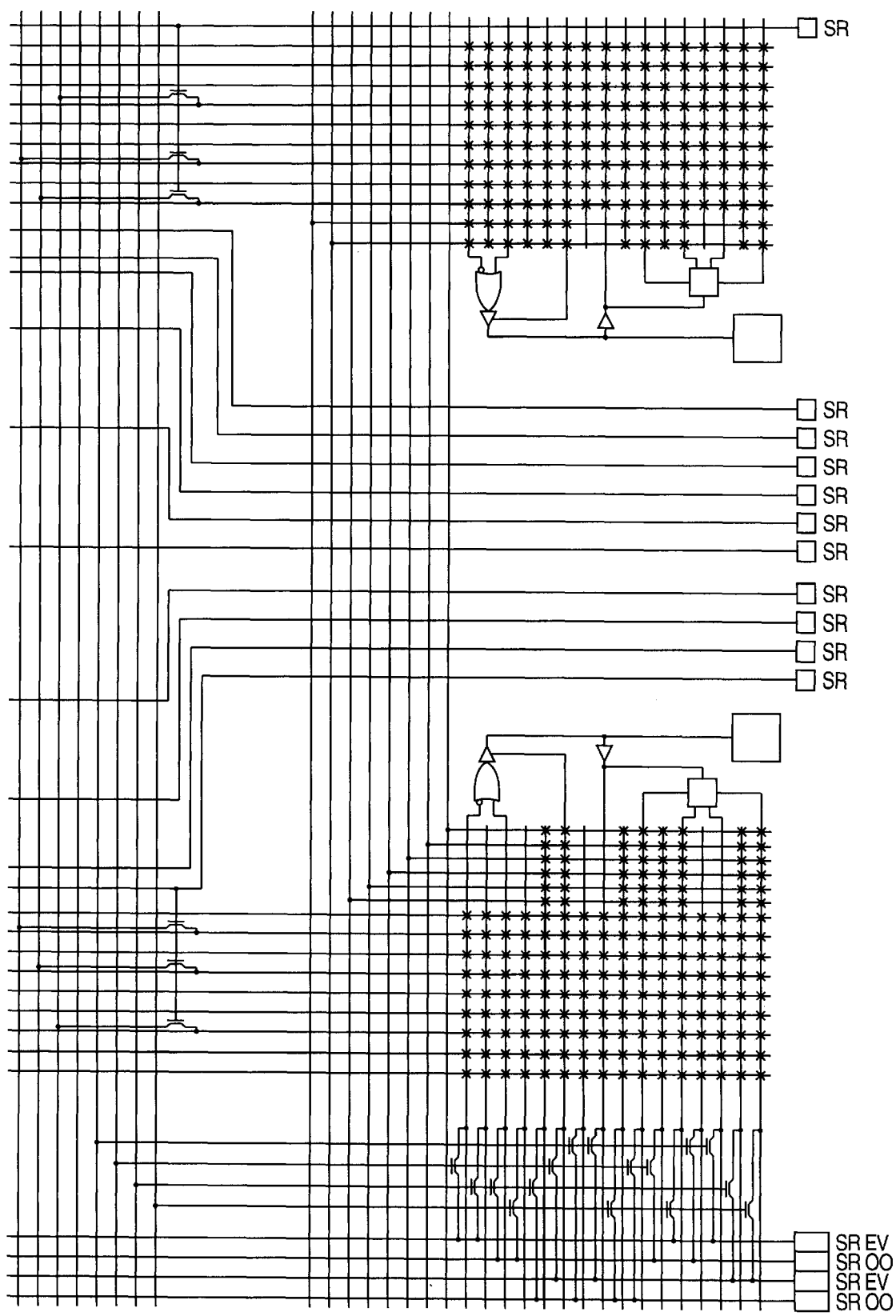
Figure 2K:
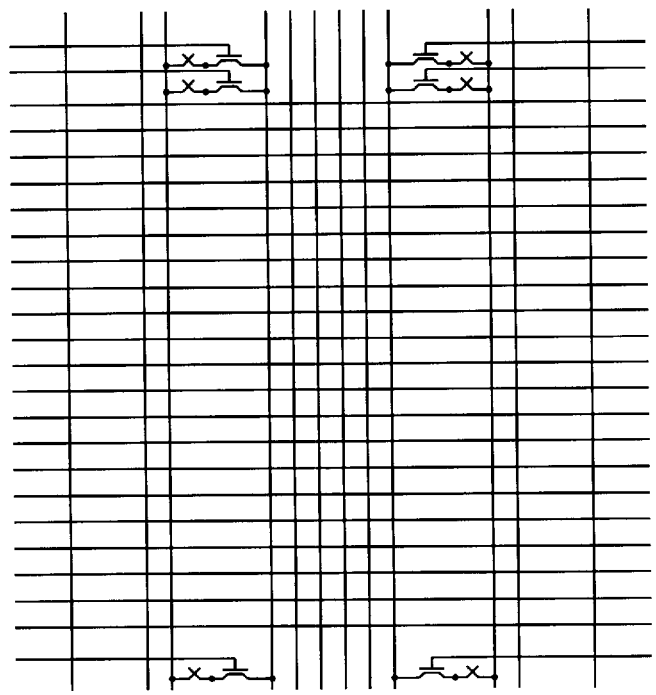
Figure 2L:
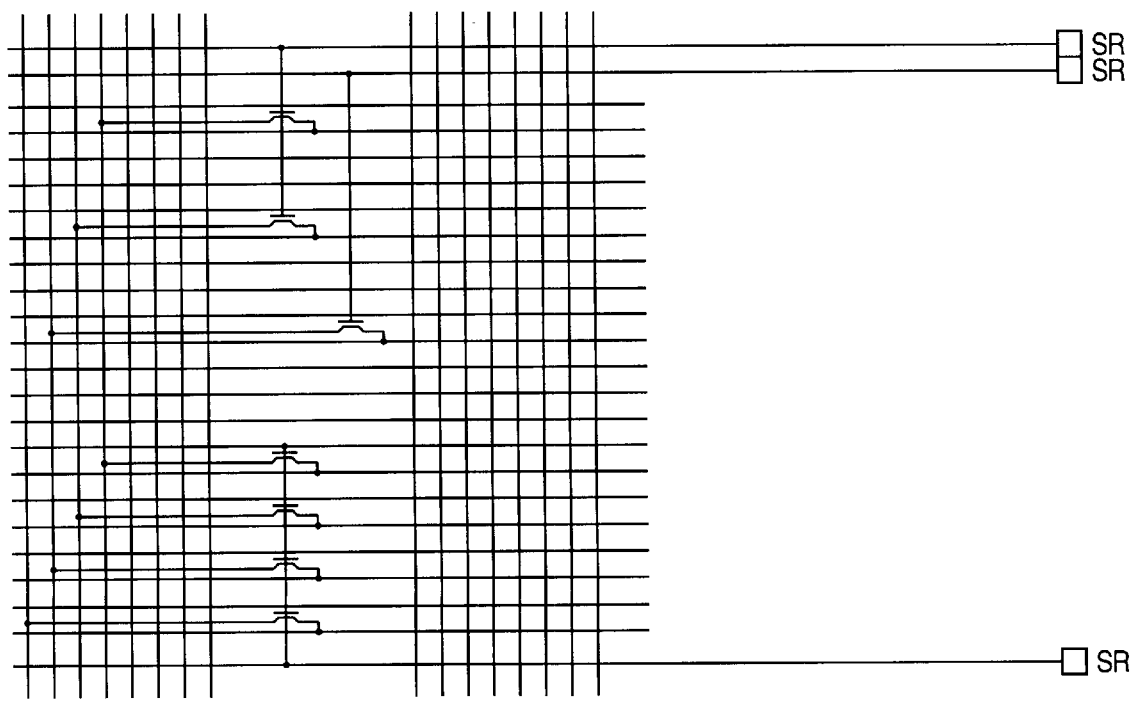
Figure 2M:
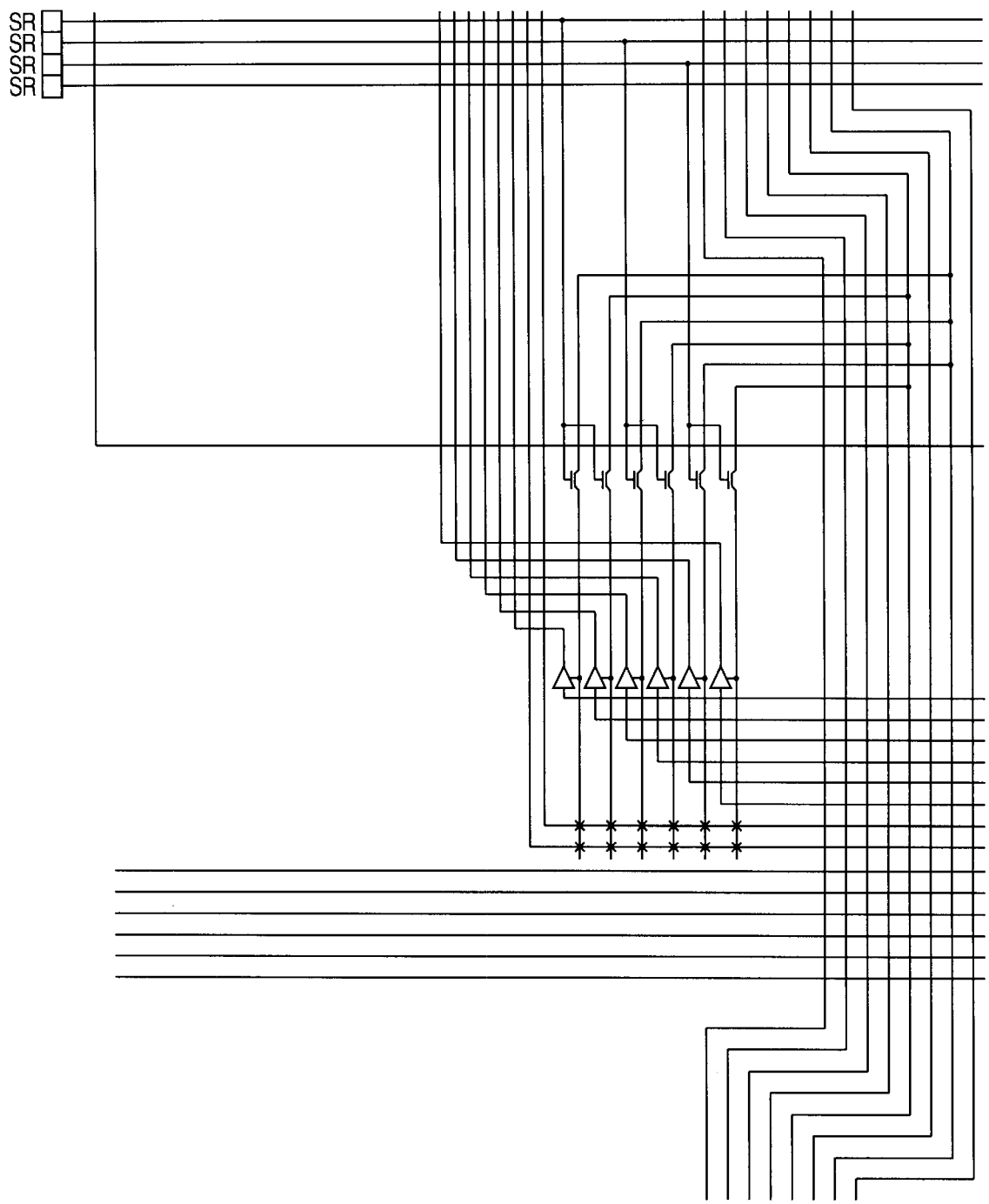
Figure 2N:
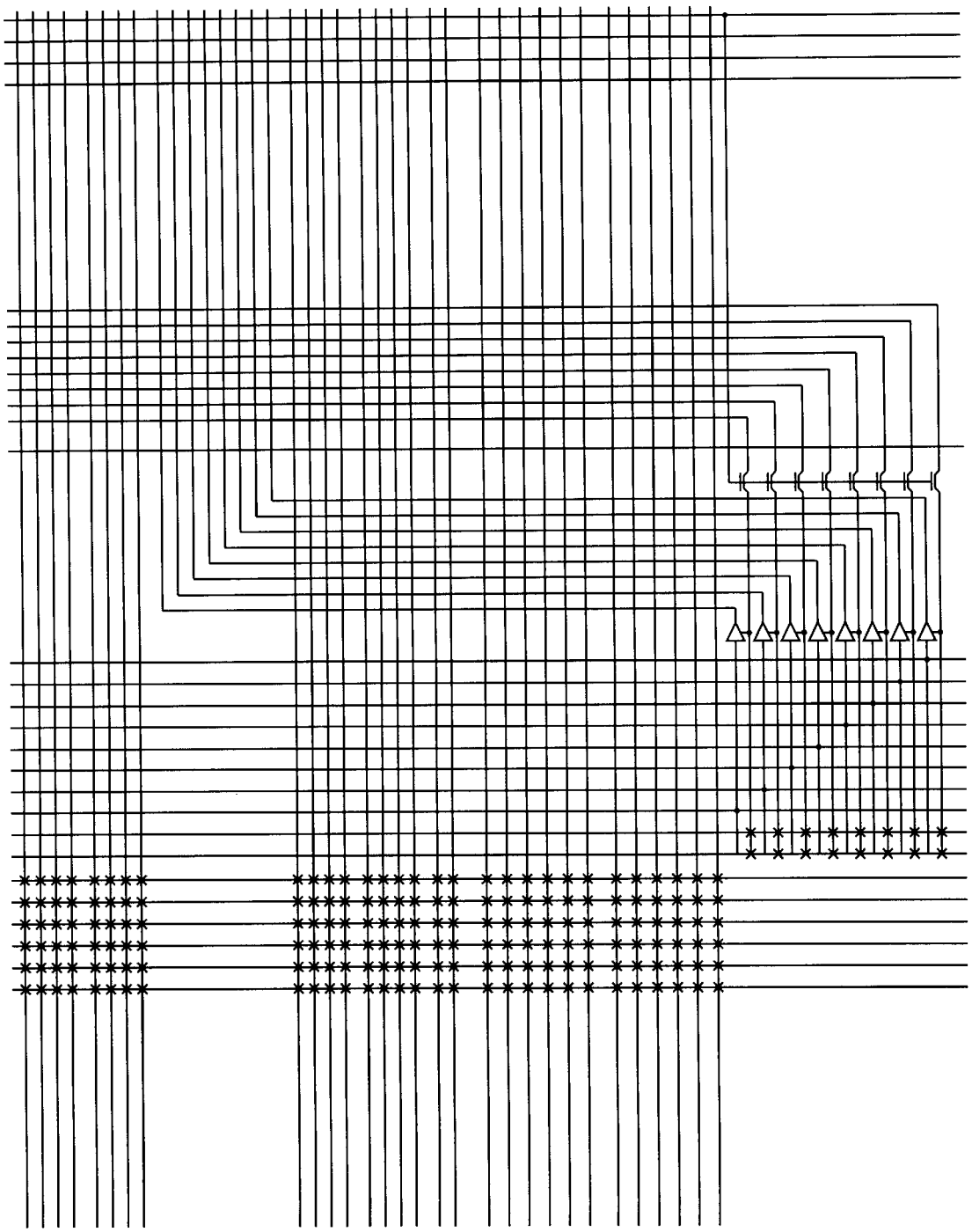

Although FIG. 2 shows two of the structures of FIG. 2B disposed between the structures of FIGS. 2A and 2C and two structures of FIG. 2B disposed between the structures of FIGS. 2C and 2D in the composite schematic, the structure of FIG. 2B could be three or more times to make programmable logic 12 wider and increase the gate count to allow programming that creates more complex circuits from programmable logic 12. It should also be understood that corresponding structures of FIGS. 2F, 2J, 2N, and 2R would similarly be repeated. Similarly, the structure of FIG. 2F could be repeated one or more times between the structures of FIGS. 2B and 2J to increase the height of programmable logic 12 and increase the gate count and the complexity of circuits implemented from programmable logic 12. A repeated portion of the integrated circuit including a module of logic elements and a portion of the programmable interconnect and its programming structure (such as the structure of 2F) is called a macrocell. Various aspects of the programmable integrated circuit of FIG. 2 are set forth below in further detail. The microfiche appendix includes a complete hierarchical schematic (including test circuitry) of programmable logic 12 of FIG. 1.

Figure 2O:
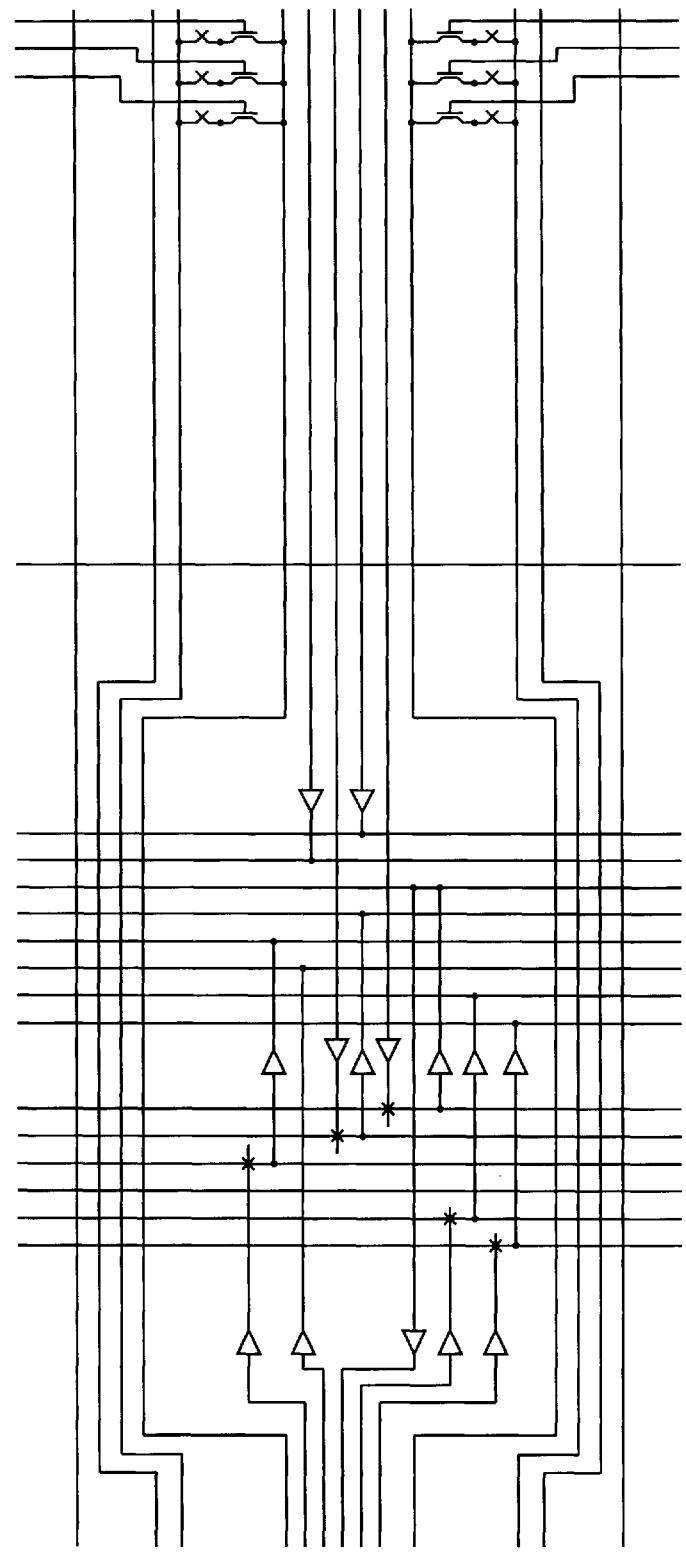
Figure 2P:
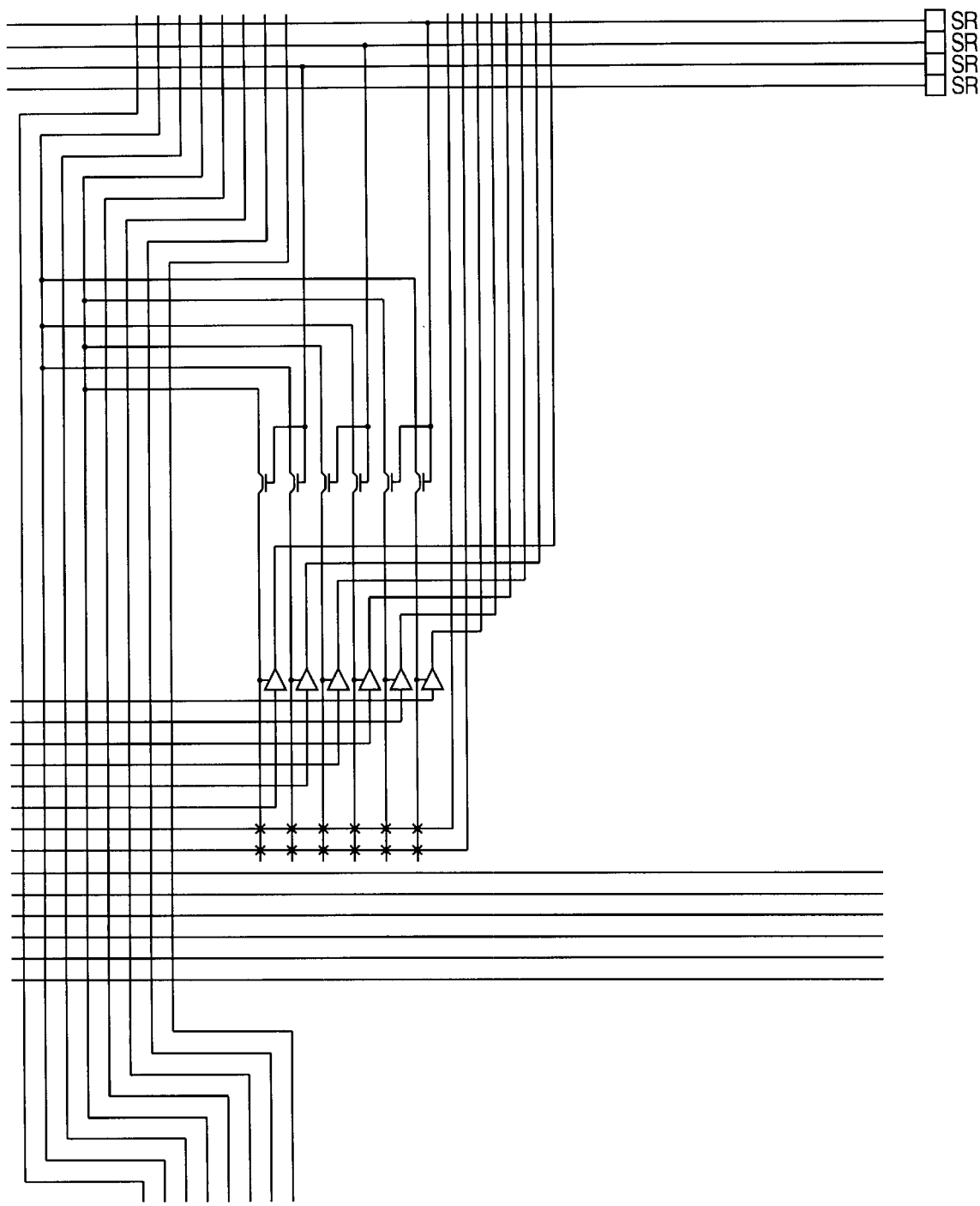
Figure 2Q:
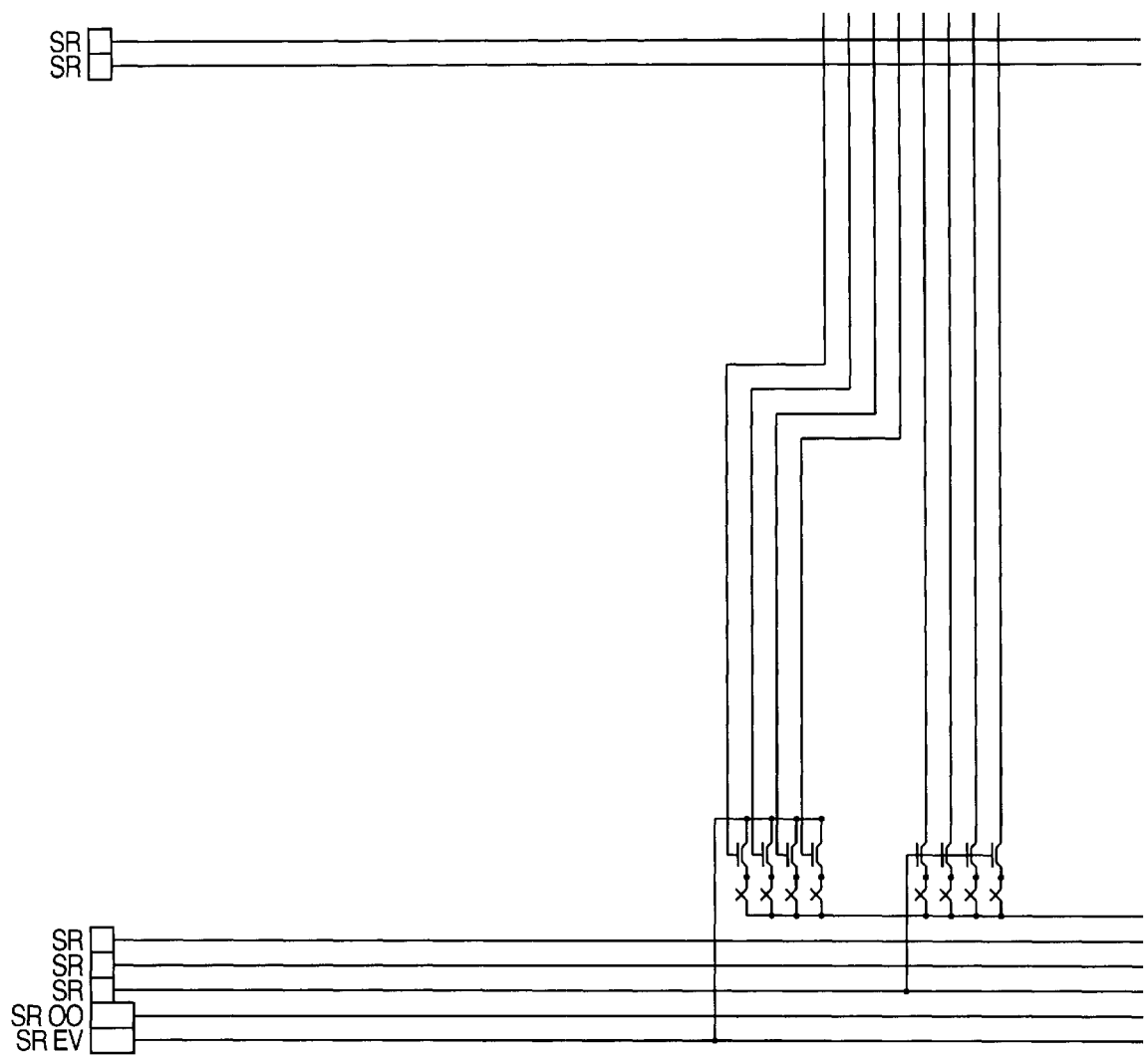
Figure 2R:
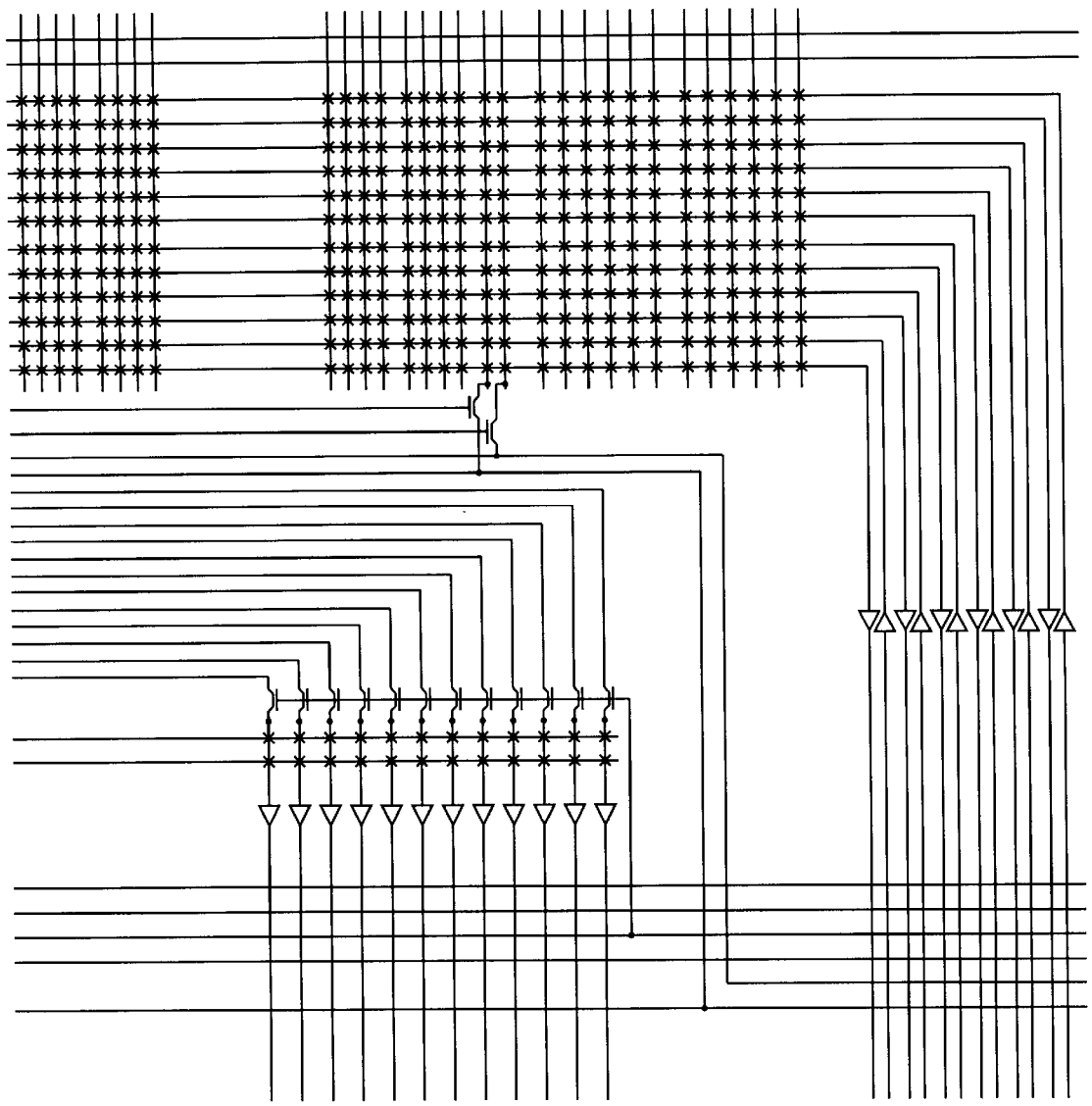
Figure 2S:
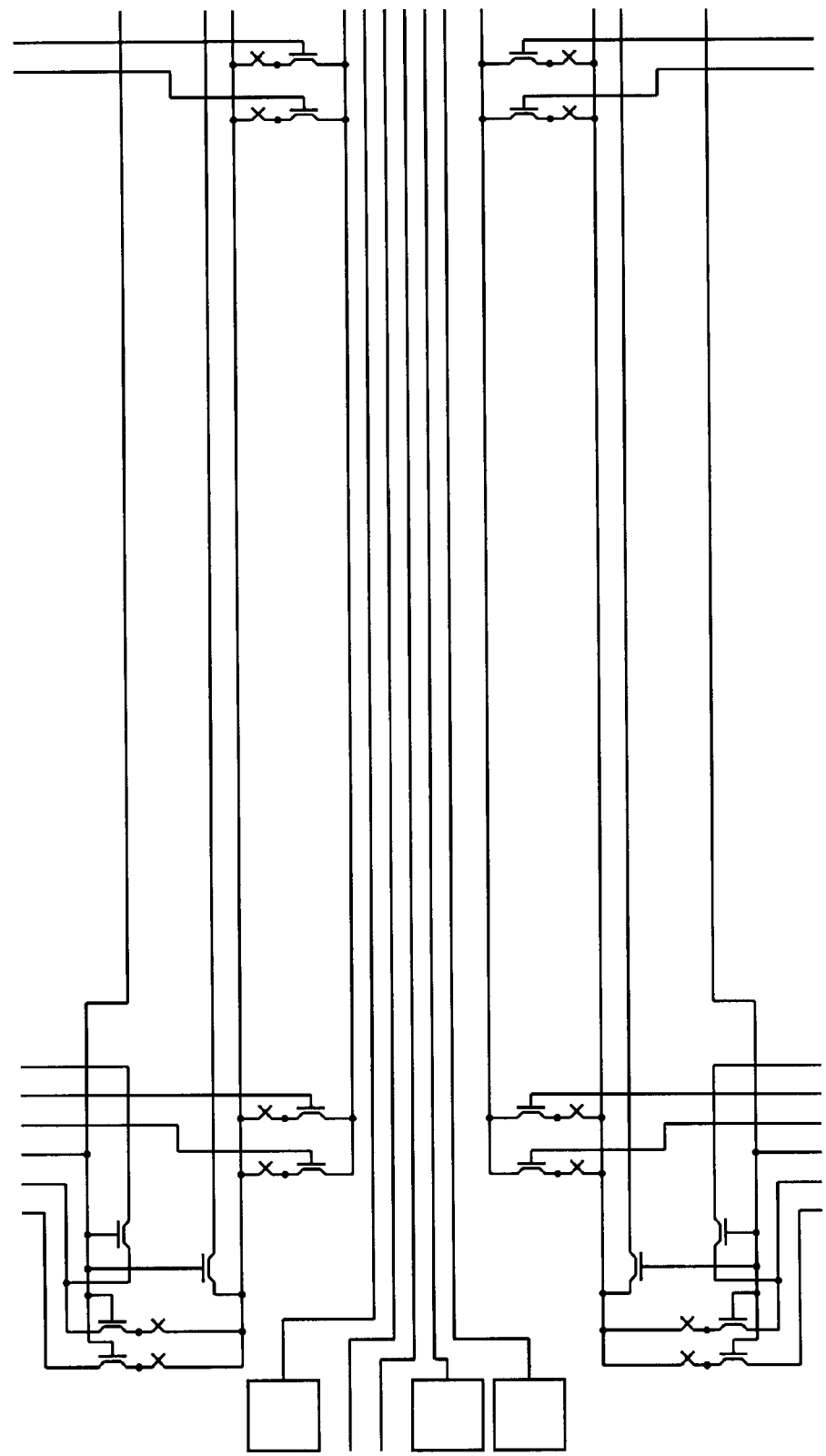
Figure 2T:
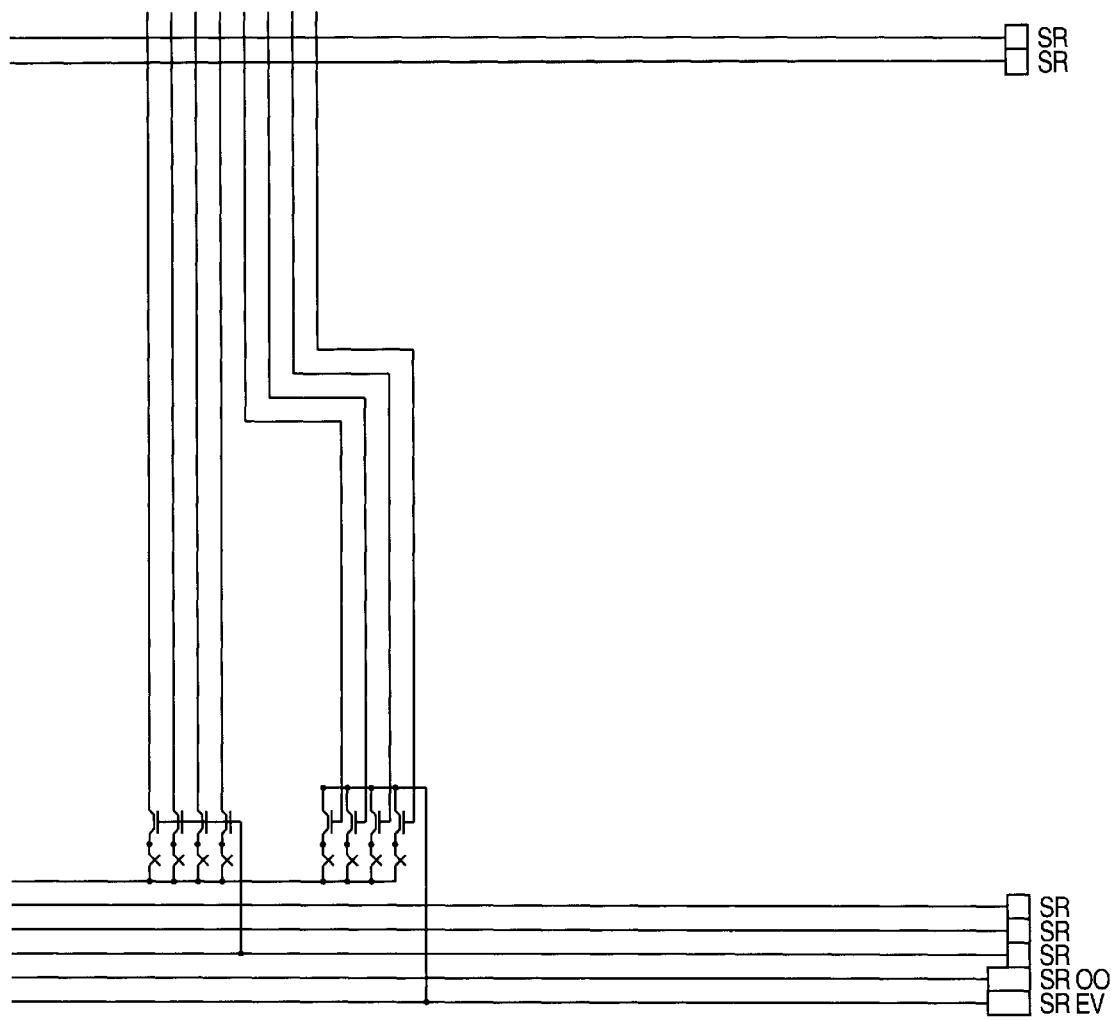

The operation of the programmable logic as shown in FIGS. 2A–2T is similar to that described in U.S. Pat. No. 5,825,201 entitled "Programmable Architecture for a Programmable Integrated Circuit Employing Antifuses" which is incorporated herein by reference.

FIGS. 2Q–2T show portions of the interface 16 between programmable logic 12 and dedicated logic 14 (shown in FIG. 1). As can be seen in FIG. 2R1, the interface between programmable logic 12 and dedicated logic 14 includes buffers 20 and an array of programmable antifuses 22, represented by the "X" symbol. Antifuses 22 may be, for example, amorphous silicon antifuses or other suitable antifuse structures, such as oxide-nitride-oxide antifuses. See, for example, U.S. Pat. No. 5,424,655, U.S. Pat. No. 5,502, 315 entitled "Electrically Programmable Interconnect Structure Having a PECVD Amorphous Silicon Element" and U.S. Pat. No. 5,557,136 entitled "Programmable Interconnect Structures And Programmable Integrated Circuits", which are incorporated herein by reference, for some suitable amorphous silicon antifuse structures.

FIG. 2R1 shows a portion of interface 16 including buffers 20 for input and output of signals from dedicated logic 14. Silicon antifuses 22 permits programmable routing of these signals into the programmable logic 12. The small size of the amorphous silicon antifuses permits the placement of a programmable element 22 at each intersection of the routing lines within interface 16, thereby providing a high level of routability in the programmable logic 12 of interface 16.

Also shown in FIG. 2R1 is PROM 18, which includes buffers 24 and an array of programmable antifuses 26. There are two antifuses coupled to each buffer. One antifuse is programmed to tie the buffer to a high voltage and the other antifuse is programmed to tie the buffer to a low voltage. As is well understood by those skilled in the art, once the antifuse is programmed it may not be unprogrammed. Consequently, the array of programmable antifuses 26 provides a non-volatile configurable memory.

Dedicated logic 14 of integrated circuit 10 may implement any desired function such as implementing a Peripheral Component Interconnect (PCI) interface. Alternatively, dedicated logic 14 can implement a variety of related or alternative functions, which might otherwise be implemented on multiple separate devices.

Figure 3:
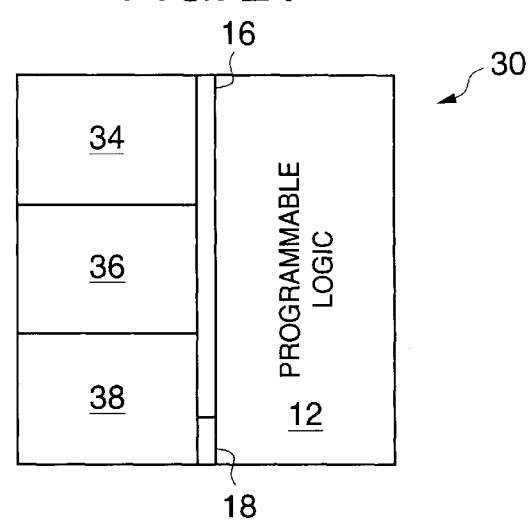
FIG. 3 is a schematic view of an integrated circuit in accordance with another embodiment of the present invention.

FIG. 3 is a schematic view of an integrated circuit 30 in accordance with another embodiment of the present invention. Integrated circuit 30 includes dedicated logic, programmable logic 12, an interface 16 and PROM 18. However, in integrated circuit 30, the dedicated logic includes a number of dedicated devices 34, 36, and 38. By properly programming the programmable elements in interface 16 or programmable logic, one or more of the desired dedicated devices 34, 36, and 38 may be activated. For example, programming arrays of programmable antifuses 22 (shown in FIG. 2R1) can connect one dedicated device to the macrocells in programmable logic 12. Thus, while embedded circuit 30 is on one piece of silicon, three different functions are independently operable. Consequently, there is no need to produce three separate circuits. In this embodiment, it may be desirable to route all input/output through programmable logic 12 so that I/O pins are not wasted on unused devices. Alternatively, volatile memory or EEPROM can configure integrated circuit 30 and dynamically select which of dedicated devices are active.

While dedicated devices 34, 36, and 38 are shown as separate devices, it should be understood that devices 34, 36, and 38 may overlap partially or completely. The programmable connection of interface 16 to devices 34, 36, and 38 controls which particular dedicated device 34, 36, or 38 is activated.

Figure 4:
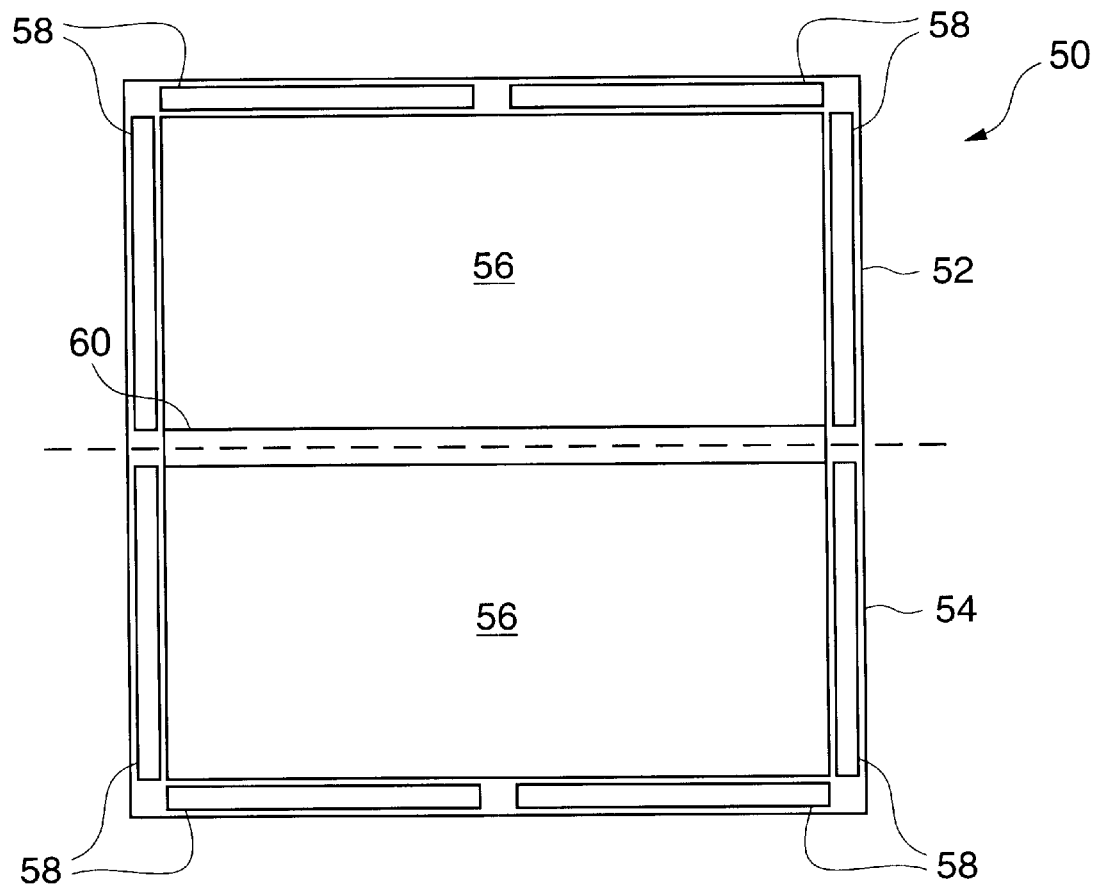
FIG. 4 is a simplified schematic view of a field programmable gate array (FPGA), part of which may be used as a platform for the programmable logic in the embedded circuit shown in FIG. 1.

FIG. 4 is a simplified schematic view of a field programmable gate array (FPGA) 50. As shown in FIG. 4, FPGA 50 includes two halves 52 and 54, with each half containing logic arrays 56 and input/output circuitry 58. Clock circuitry 60 is between logic arrays 56 and distributes clock signals to the two halves 52 and 54. FPGA 50 is a complete viable circuit with, e.g., half 52 including the structures shown in FIGS. 2A–2P and the other half 54 being a mirror image of half 52.

To generate integrated circuit 10 (FIG. 1), half 52 of FPGA 50 forms programmable logic 12, and dedicated logic 14 replaces the other half 54. Programmable interface illustrated in FIGS. 2Q to 2T is added to connect the dedicated logic to the programmable logic. Thus, one half of a viable FPGA 50 with the addition of interface 16 provides a platform for producing integrated circuit 10. By using all or a portion of the structure or layout of an existing programmable logic device as the platform for integrated circuit 10, the need to design new programmable logic is avoided. Further, the same platform can accommodate a variety of different dedicated devices. For example, the same platform might include a PCI bus interface circuit where the programmable logic creates a user programmable interface for other ICs in a PCI device, or the platform might include a processor where the programmable logic provides a user programmable interface to the processor. Further, having common programmable logic in different devices simplifies the task of creating programming tools that configure the programmable logic for a user's needs.

Figure 5:
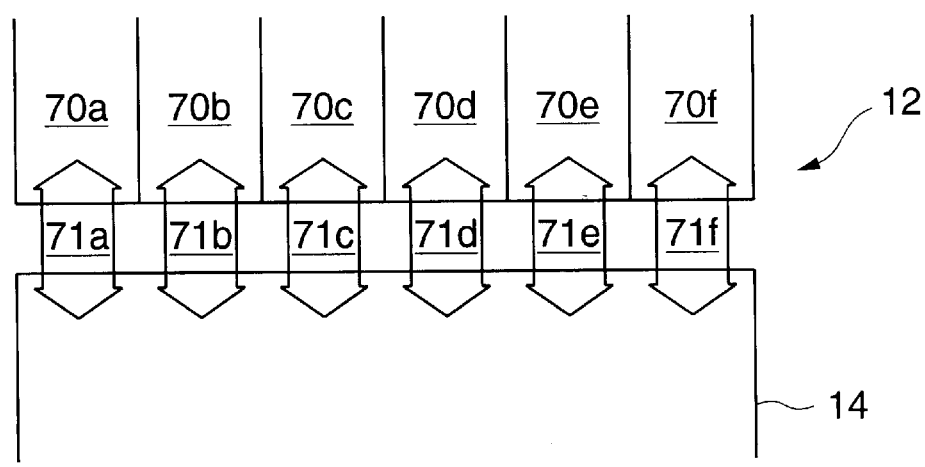
FIG. 5 shows the interface between the dedicated device and a plurality of macrocells in the programmable logic.

FIG. 5 shows the interface between a plurality of macrocells 70a, 70b, 70c, 70d, 70e, and 70f, which are in programmable logic 12, and dedicated logic 14. The routing lines for transfers of signals between dedicated logic 14 and programmable logic 12 or PROM 18 are evenly distributed amongst all the macrocells. However, connections of the routing lines in macrocells 70a–70f are according to the logic to be implemented. For example, integrated circuit 10 has 264 bits from programmable logic 12 to dedicated logic 14 and 264 bits from dedicated logic 14 to programmable logic 12 and 528 bits from PROM 18 to dedicated logic 14. As discussed above, because the interface for each macrocell contains a number of routing resources with an array of programmable antifuses 22, the interface for each macrocell has a high level of routability.

Figure 6:
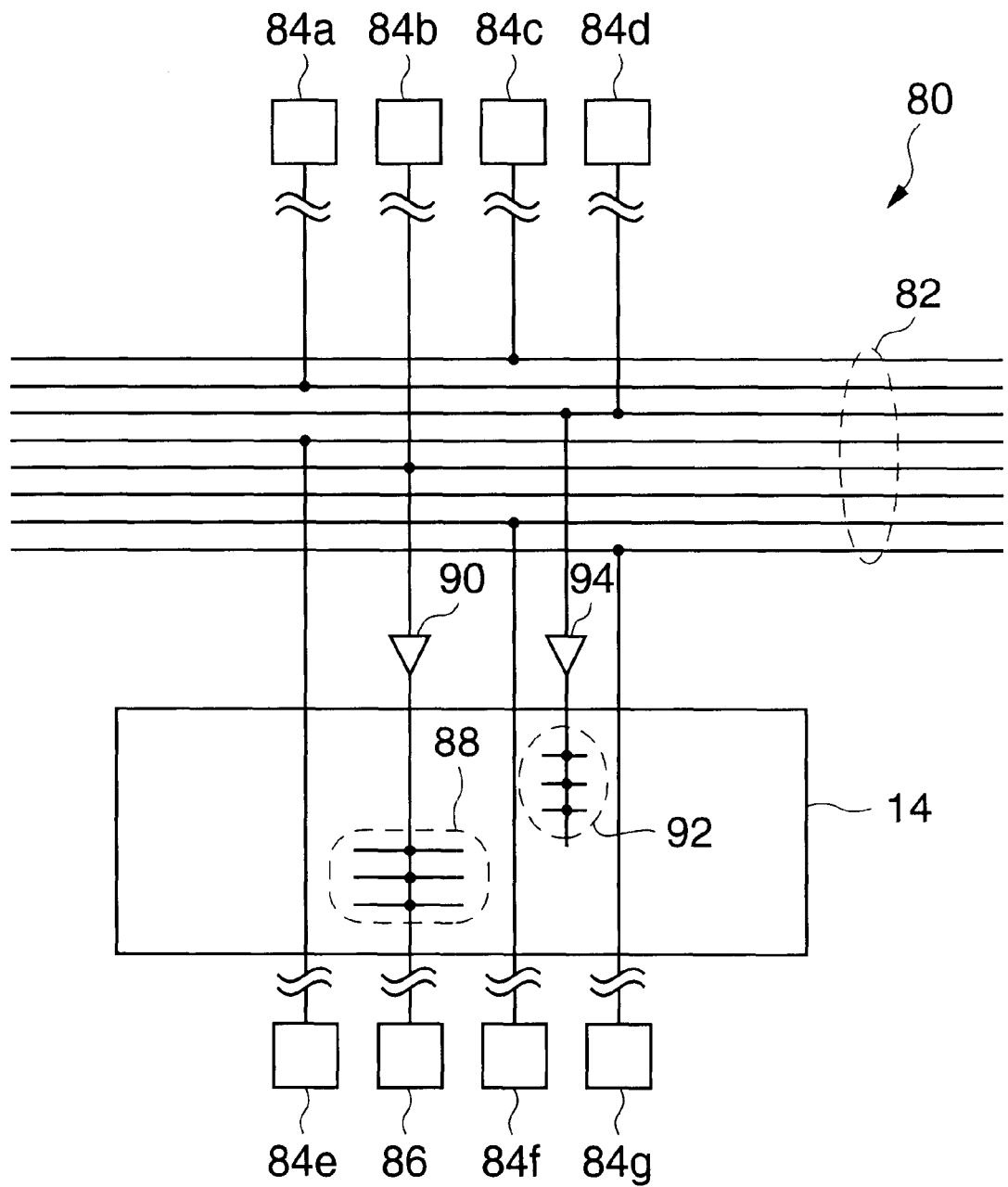
FIG. 6 is a simplified view of the clock interface between the programmable logic and the dedicated device.

FIG. 6 is a simplified view of the clock interface 80 between programmable logic 12 and dedicated logic 14. The clock interface 80 includes a number of routing resources 82 that are routed throughout programmable logic 12. Pads 84a, 84b, 84c, 84d, 84e, 84f, 84g, which receive clock signals, are coupled to routing resources 82. Some of the pads, e.g., pads 84e–g, may be disposed on an opposing side of the circuit from the other pads, e.g., pads 84a–d. Thus, the conductors from pads 84e–g are routed through dedicated logic 14 to routing resources 82.

Pad 86 receives a clock signal DCLK that drives dedicated logic 14 and is therefore coupled to routing resources 88 that are internal to dedicated logic 14. It is desirable for programmable logic 12 to receive the clock signal that drives dedicated logic 14 so that both programmable logic 12 and dedicated logic 14 may be driven with the same timing. Thus, pad 86 is also coupled to at least one of the routing resources 82 via buffer 90. It is also desirable for dedicated logic 14 to receive a clock signal that drives programmable logic 12. Thus, at least one of pads 84a–g, e.g., pad 84d, is coupled via buffer 94 to routing resources 92, which are internal to dedicated logic 14. In one embodiment of the invention, lines and I/O pads for clock signals are dedicated for that purpose and different from lines and I/O pads for data signals. However, additional buffers and routing resources may be used if desired. A more detailed view of clock interface 80 is shown, for example, in FIG. 2o.

Figure 7:
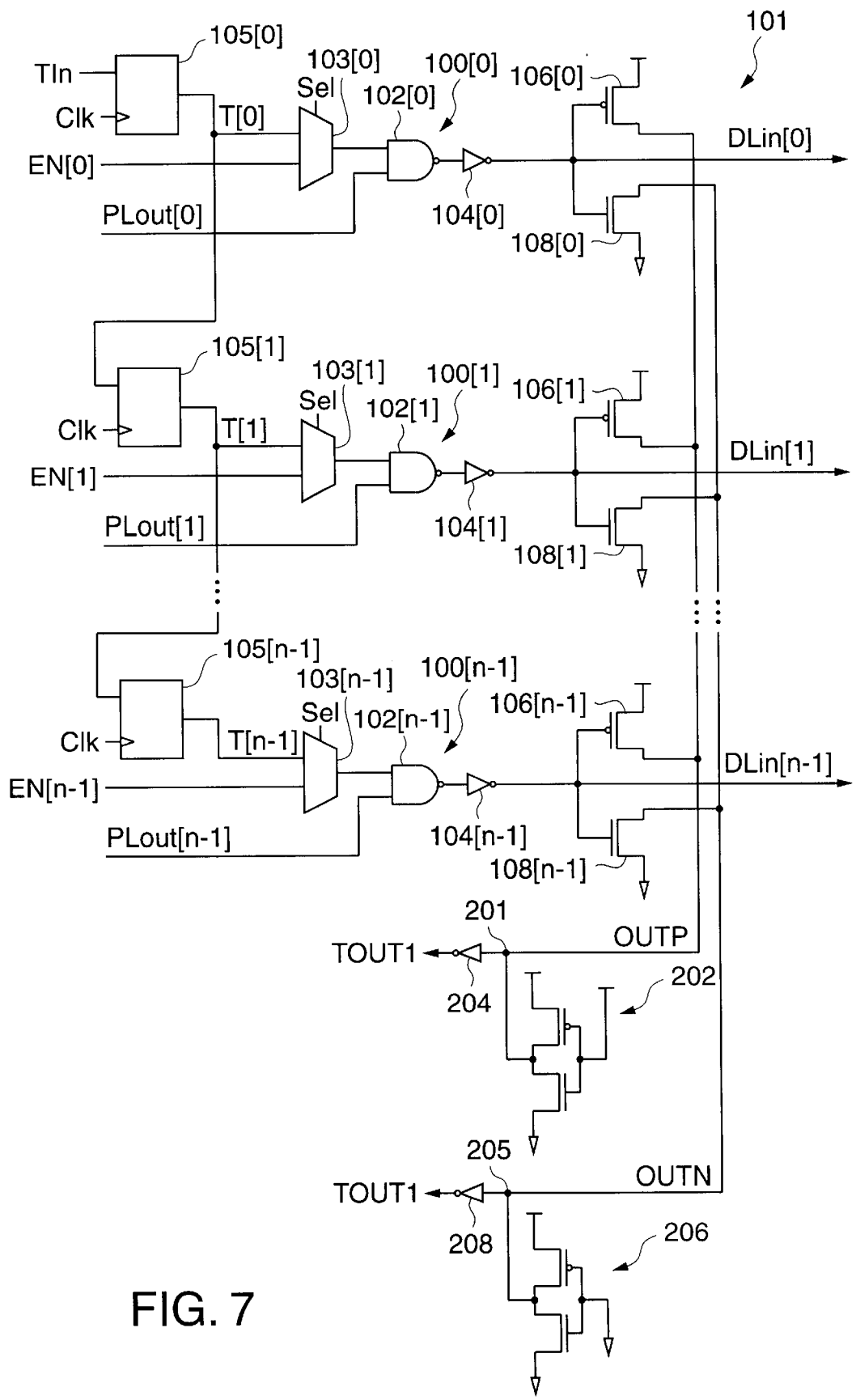
FIG. 7 is a simplified diagram showing two interface buffers and testing circuits.

In accordance with another aspect of the invention, interface 16 includes test circuitry that enables testing of programmable logic 12, dedicated logic 14, and interface 16 before programming of programmable logic 12. FIG. 7 is a simplified diagram illustrating circuitry for testing buffers in the interface 16. Shown in FIG. 7 are buffers 100[0] to 100[n–1] that during a normal mode receive signals PLout[0] to PLout[n–1] from programmable logic 12 and generate signals DLin[0] to DLin[n–1] for dedicated logic 12. Each buffer 100[i] includes a NAND gate 102[i] and an inverter 104[i] for i from 0 to n–1. One input terminal each NAND gate 102[i] receives a corresponding signal PLout[0] from the programmable logic. The other input terminal of each NAND gates 102[0] to 102[n–1] receives the output signal from a corresponding one of multiplexers 103[0] to 103[n–1].

A select signal to multiplexers 103[0] to 103[n–1] control whether buffers 100[0] to 100[n–1] operating in a normal mode or a test mode. In normal mode, the select signal causes multiplexers 103[0] to 103[n–1] apply enable signal EN[0] to EN[n–1] to the respective second input terminals of NAND gates 102[0] to 102[n–1]. Each of enable signals EN[0] to EN[n–1] is high (low) to enable (disable) the corresponding one of buffers 100[0] to 100[n–1] during normal mode operation.

In test mode, the select signal causes multiplexers 103[0] to 103[n–1] apply respective test signals T[0] to T[n–1] output from registers 105[0] to 105[n–1] to the respective second input terminals of NAND gates 102[0] to 102[n–1]. Registers 105[0] to 105[n–1] are connected in a chain with the output terminal of register 105[i] connected to the input terminal of register 105[i+1] for i from 0 to n–2. A clock signal Clk controls latching of values of an input test signal TIn into register 105[0] and propagation of the values down the chain of registers 105[0] to 105[n–1].

A testing circuit 101 includes PMOS transistors 106[0] to 106[n–1] and NMOS transistors 108[0] to 108[n–1] having gates coupled to the output terminals of associated buffers 100[0] to 100[n–1]. As shown in FIG. 7, each of PMOS transistors 106[0] to 106[n–1] is between supply voltage Vcc and a test line 201, and each of NMOS transistors 108[0] to 108[n–1] is between ground and a test line 205. A low current pull down device 202 maintains a test signal outp on line 201 in a low voltage state if none of the PMOS transistors 206 are on. One or more of PMOS transistors 106[0] to 106[n–1] coupled to test line 201 pull test signal outp high (to Vcc) if any of output buffers 100[0] to 100[n–1] has a high output signal. Similarly, a low current pull-up device 206 keeps a test signal outn high on line 205 if all of NMOS transistors 108[0] to 108[n] are off, and one or more NMOS transistors 108[0] to 108[n–1] pull test signal outn low if any of buffers 100[0] to 100[n] has a low output signal.

To test buffers 100[0] to 100[n–1], select signal sel causes multiplexer 103[0] to 103[n–1] to route signals T[0] to T[n–1] to NAND gates 102[0] to 102[n–1]. Signals PLout [0] to PLout[n–1] to the other input terminals of NAND gates 102[0] to 102[n–1] are high from unprogrammed programmable logic 12. U.S. Pat. No. 5,302,546 entitled "Programming of Antifuses," which is incorporated herein by reference describes an FPGA having output signals that are high when the FPGA is unprogrammed. Accordingly, the voltage states of test signals T[0] to T[n–1] control the output signals from buffers 100[0] to 100[n–1]. If the data signal T[i] applied to any NAND gate 102[i] is high, the corresponding inverter 104[i] should produce a high signal which turns on NMOS testing transistor 108[i] and turns off PMOS testing transistor 106[i]. NMOS transistor 108[i], when on, pulls down signal outn. If, on the other hand, data signal T[i] is low, inverter 104[i] should produce a low signal which turns off NMOS testing transistor 108[i] and turns on PMOS testing transistor 106[i]. PMOS transistor 106[i], when on, pulls up signal outp.

Inverters 204 and 208 generated output signals TOUT1 and TOUT2 indicating the states of signals outp and outn on test busses 201 and 205. A test process gives input test signal TIn a set of values and observes the resulting states of output test signals TOUT1 and TOUT2 to test the operation of buffers 100[0] to 100[n–1]. For example, if test signal TIn remains low so that all of test signals T[0] to T[n–1] are low, properly operating buffers 100[0] to 100[n–1] turn on all PMOS transistors 106[0] to 106[n–1] and turn off all NMOS transistors 108[0] to 108[n–1]. In this case, signals outp and outn are high, and signals TOUT1 and TOUT2 from inverters 204 and 208 are both low. However, if any of buffers 100[0] to 100[n–1] is malfunctioning so that one or more of the output signals DLin[0] to DLin[n–1] is low, one or more of NMOS transistors 108[0] to 108[n–1] pulls signal outn low, and test signal TOUT2 is high indicating a defective buffer.

Raising signal TIn high for a single clock cycle while all of signals T[0] to T[n–1] are low, starts a high voltage state propagating through signals T[0] to T[n–1] from registers 105[0] to 105[n–1]. The signals T[i] that is high turns off the corresponding transistor 106[i] and turns on the corresponding transistor 108[i]. Accordingly, since at least one of the transistors 108[0] to 108[n–1] should be on the whole time that the high state is propagating through registers 105[0] to 105[n–1], test output signal TOUT2 should remain high. If test output signal falls to low during any clock cycle i after raising signal TIn, a buffer 100[i] is malfunctioning by not raising an output signal DLin[i] to the high state when signal T[i] is high. The malfunctioning buffer can be identified from the time at which the state of signal TOUT2 changes.

Similar test patterns for signal TIn can raise all of signals T[0] to T[n–1] to the high state and drop the voltage state of signal TIn to low for one clock cycle. Other test patterns can also be employed. In this manner, individual defective buffers can be identified. The described tests advantageously permits testing of interface buffers 100[0] to 100[n–1] without any programming of the programmable elements of the programmable logic.

Figure 8:
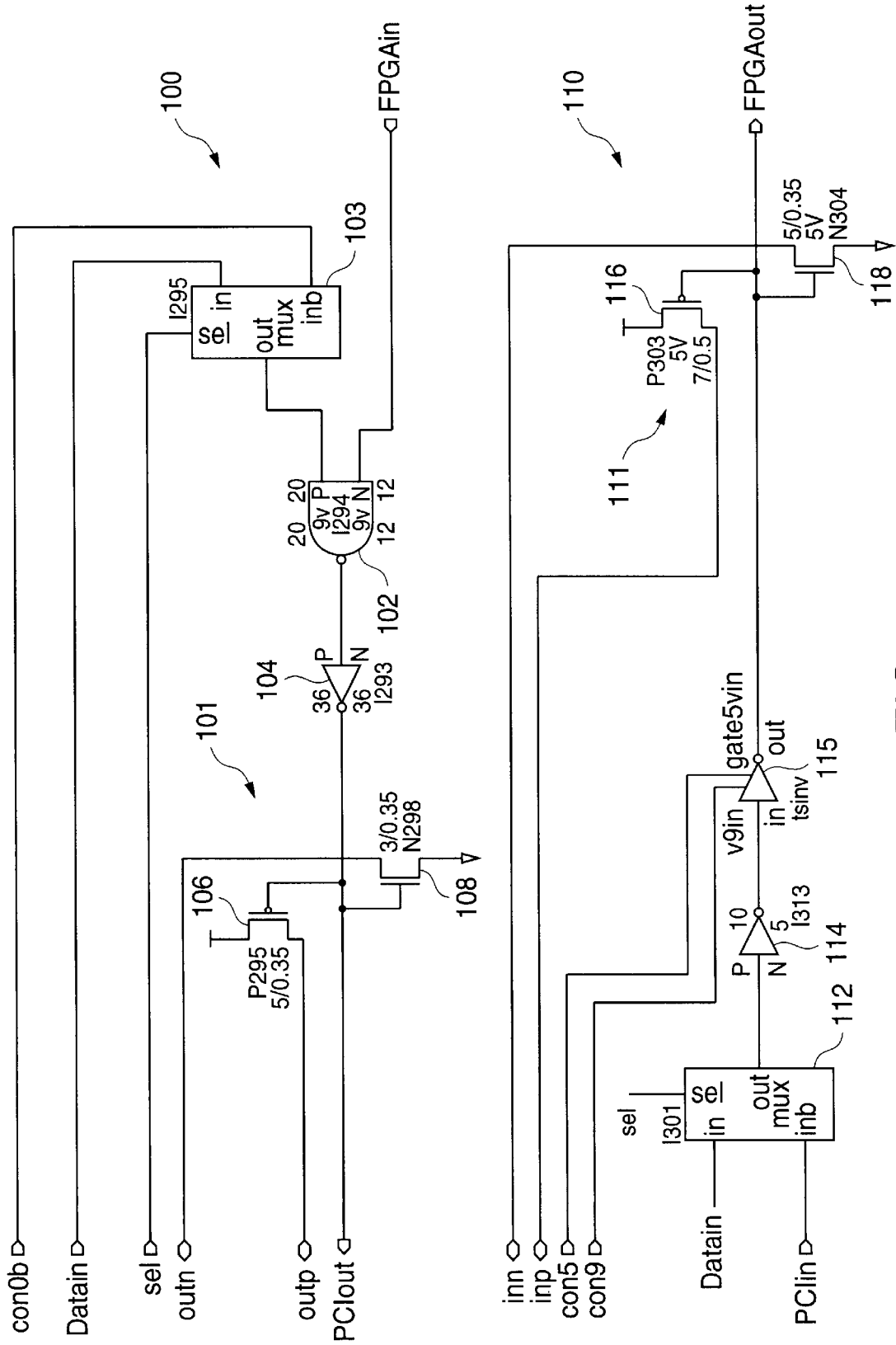
FIG. 8 is simplified diagram showing an interface buffer and testing circuit between the programmable logic and the dedicated device and an interface buffer and testing circuit between the dedicated device and the programmable logic.

Test circuitry similar to that shown in FIG. 7 can also be used to test buffers conveying signals from the dedicated logic to the programmable logic. Further, the two kinds of buffers could be connected in the same scan chain or separate scan chains for testing. FIG. 8 is a simplified diagram showing an interface buffer circuit 100 that receives a signal FPGAin from programmable logic 12 and generates a signal PCIout to dedicated logic 14 and an interface buffer 110 that receives a signal PCIin from dedicated logic 14 and generates a signal FPGAout to programmable logic 12. Interface buffer circuit 100 includes an input multiplexer 103, a NAND gate 102, an inverter 104, and transistors 106 and 108 that operate in the manner described above for similarly-numbered elements. Signals con0b and Datain of FIG. 8 correspond to signals EN[i] and T[i] in FIG. 7.

Interface buffer circuit 110, includes an input multiplexer 112, a first inverter 114, a second inverter 115, a PMOS transistor 116, and an NMOS transistor 118. Interface buffer circuit 110 differs from interface buffer circuit 100 in that interface buffer circuit 110 has enable signals con5 and con9. With the enable signals connected in this manner, NAND gate 102 is replaced with inverter 114, and multiplexer 112 can select either signal PCIin from dedicated logic 14 or test signal Datain for generation of output signal FPGAout. PMOS transistor 116 and NMOS transistor 118 have gates coupled to receive output signal FPGAout and pull respective signals inp and inn respectively up and down according to the state of signal FPGAout. Signals inn and inp are on a test bus for a set of buffers 110.

Figure 9:
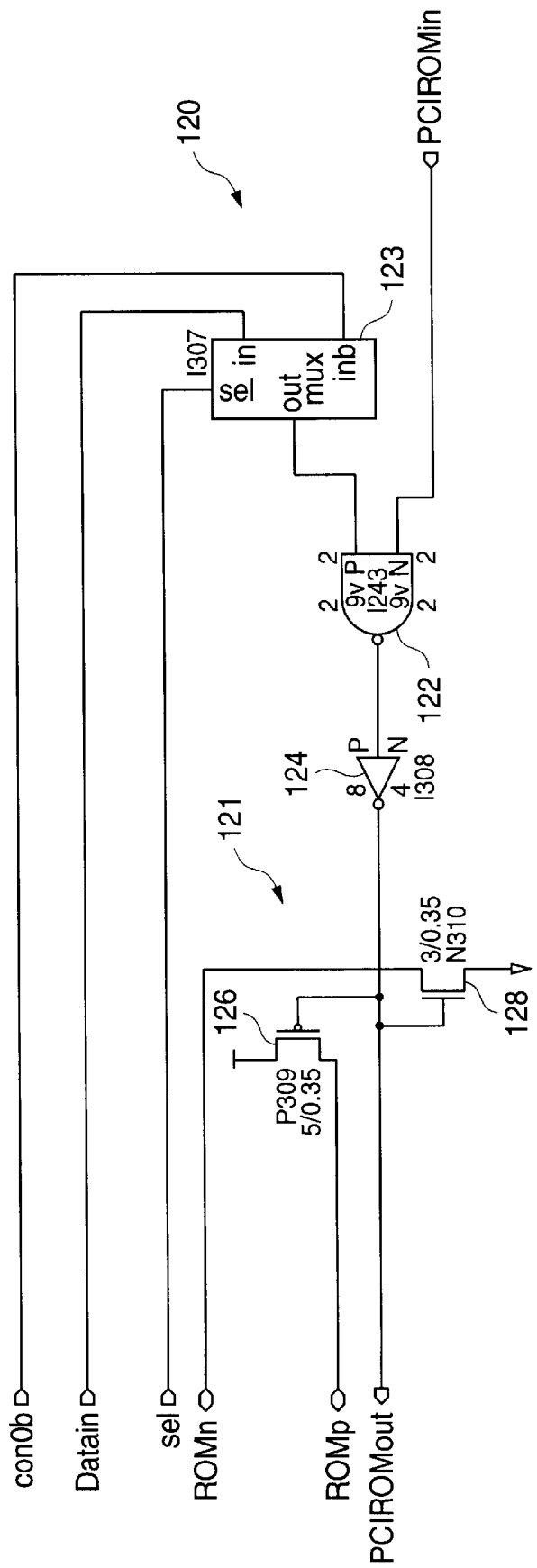
FIG. 9 is a simplified diagram showing an interface buffer and testing circuit between a PROM and the dedicated device.

FIG. 9 shows an interface buffer circuit 120 for use between PROM 18 and dedicated logic 14. Interface buffer circuit 120 includes a multiplexer 123, a NAND gate 122, an inverter 124, a PMOS transistor 126, and an NMOS transistor 128, which are substantially identical to corresponding elements 103, 102, 104, 106 and 108 of FIG. 8. Interface buffer circuit 120 differs from interface buffer circuit 100 in input and output signals PCIROMin and PCIROMout and test signals ROMn and ROMp. Signal PCIROMin represents a data bit from PROM 18. Signal PCIROMout represents the data bit passes to dedicated logic 14. Test signals ROMn and ROMp are signals on separate test busses (not shown) for testing a set of interface buffers 120 in the same manner that test signals outn and outp test a set of interface buffers 100.

Figure 10:
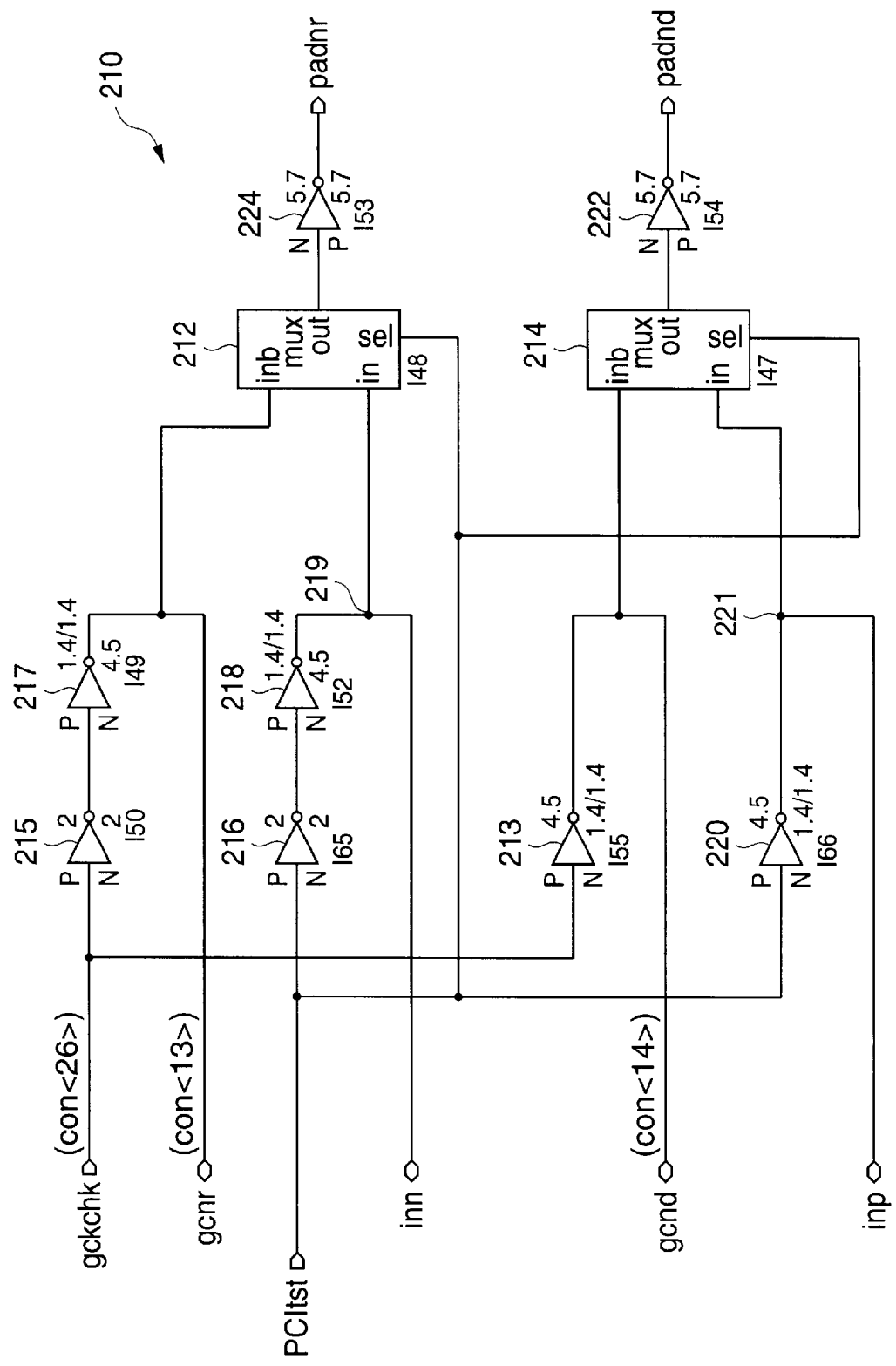
FIG. 10 is a simplified diagram of a weak detection circuit that is coupled to testing transistors and in a testing circuit.

FIG. 10 is a simplified diagram. of a detection circuit 210 that coupled to testing transistors 116 and 118 in a set of interface buffers 110. Detection circuit 210 functions the same as the combination of pull-down 202, pull-up 206, inverter 204, and inverter 208 described above. Testing transistors 126 and 128 in interface buffers 120 can couple to a similar detection circuit. Signals inp and inn to detection circuit 210 have levels according to the conductivities of transistors 116 and 118, respectively. Detection circuit 210 also receives a test signal at terminal PCItst that is high during a test. Test signal PCItst is applied to select terminals of multiplexers 212 and 214 and also received by inverters 216 and 220. When signal PCItst is high, the combination of inverters 216 and 218 provides a low-current drives signal to pull-up the bus carrying signal inn, and inverter 220 provides a low-current drives signal to pull-down the bus carrying signal inp.

Signals gcnr and gcnd are test signals similar to signals inn and inp from other test buses (not shown). Inverter 213 provides a low current bias device for the test bus carrying signal gcnd. Inverters 215 and 217 provide a low current bias device for biasing the test bus carrying signal gcnr, and a signal gckchk determines whether the biasing devices pull the test bus for signals gcnd and gcnr up or down. Multiplexers 212 and 214 select which of the test signals gcnr, inn, gcnd, and inp are applied to inverters 224 and 222 to generate the output signals padnr and padnd at I/O pads of the integrated circuit.

Figure 11:
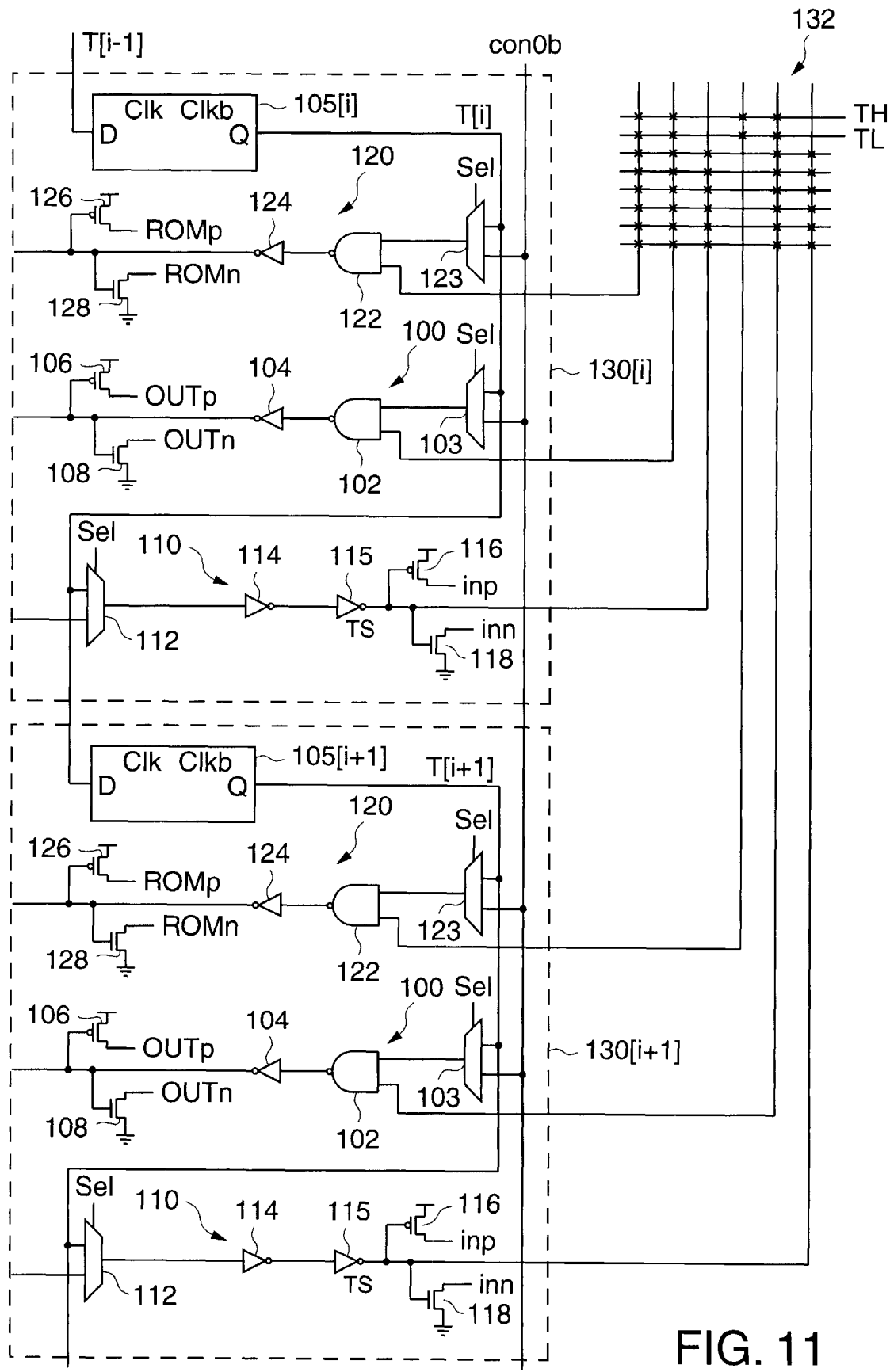
FIG. 11 is a diagram showing the interconnection of one cell of interface buffers and associated testing structures.

FIG. 11 is a diagram showing the interconnection of interface cells 130, where each interface cell includes interface buffer types 100, 110, and 120 and associated testing structures. Although FIG. 11 shows only two interface cells 130[i] and 130[i+1], a large number of cells can be serially coupled in and actual device. For example, in one embodiment there are 264 cells of interface buffers that are coupled together. Further, each interface cell need not include an equal number of interface buffers 100, 110, and 120. For example, in one embodiment, each interface cell has six interface buffers 100, six interface buffers 110, and twelve interface buffer 120.

In each interface cell 130[i], a data register 105[i] provides the test data signal T[i] to the interface buffers in cell 130. Data register 105[i] receives a test signal T[i−1] from a previous cell (not shown) or from an input/output terminal if cell 130[i] is the first cell in the series. The output terminal of data register 105 provides test signal T[i] to each buffer 100, 110, and 120 in interface cell 130[i] and to another data register 105[i+1] that is in the next interface cell 130[i+1]. Accordingly, the same input test signal TIn as described in detail in reference to FIG. 7 can be used for testing of all of interface buffers 100, 110, and 120.

Because the registers in each cell provide the test signal T[i] and test bus signals are from the testing transistors, it is unnecessary to program the routing structure 132 for a test. Thus, the interface buffers can be tested without affecting the programmability of the routing resources.

Figure 12:
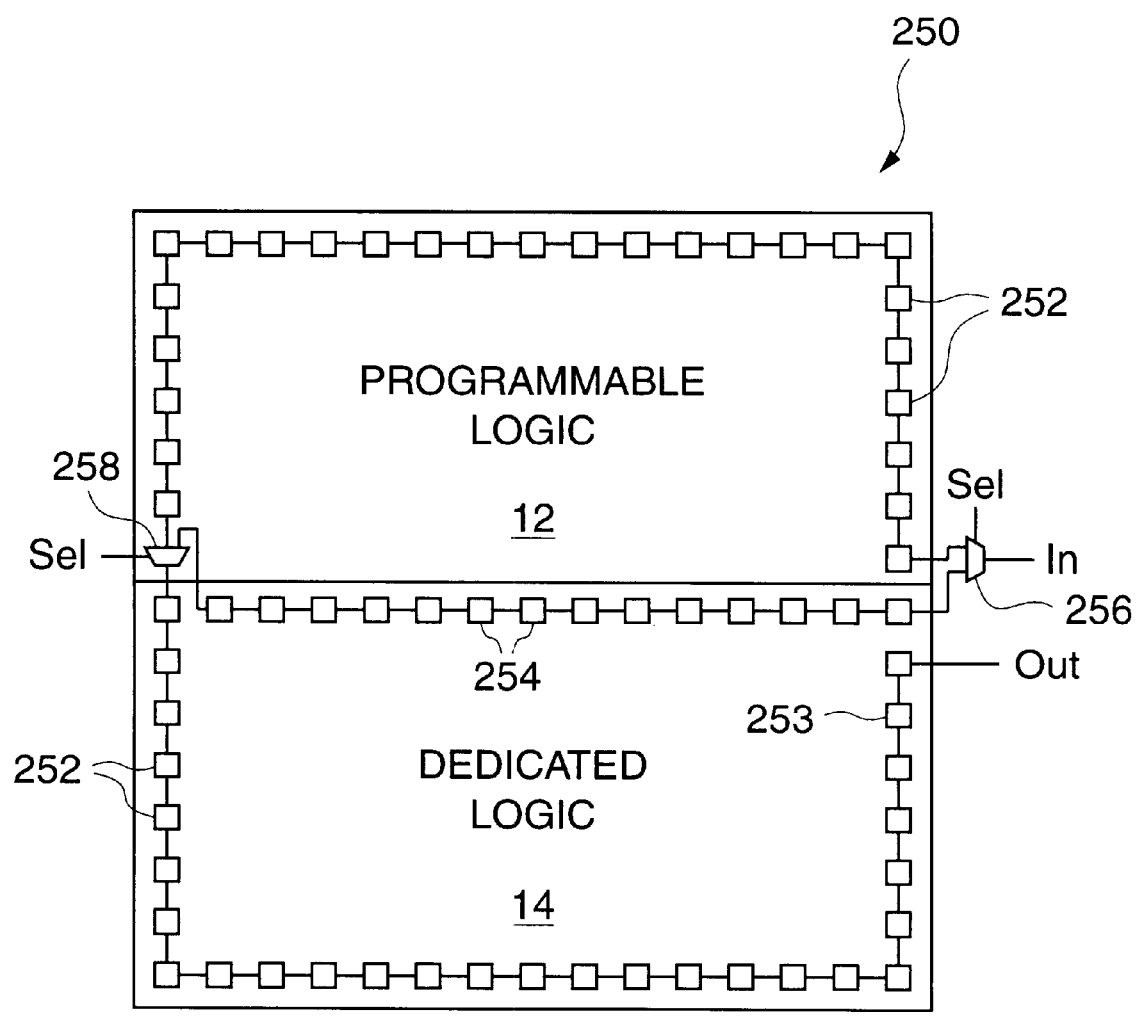
FIG. 12 is a simplified diagram of the JTAG circuitry in accordance with an embodiment of the present invention.

FIG. 12 is a simplified diagram of an integrated circuit 250 including the JTAG circuitry in accordance with another aspect of the present invention. As is well known in the art, JTAG registers are used to test the input/output at the terminals or pads of an integrated circuit. However, as shown in FIG. 12, JTAG blocks 252 and 254 can be employed at the I/O of integrated circuit 250 (on the perimeter of IC 250 in FIG. 12) and in the interface between dedicated logic 14 and programmable logic 12. In FIG. 12, demultiplexer 256 and multiplexer 258 direct a test signal for JTAG testing either around the perimeter of the entire chip or around the dedicated logic.

Figure 13:
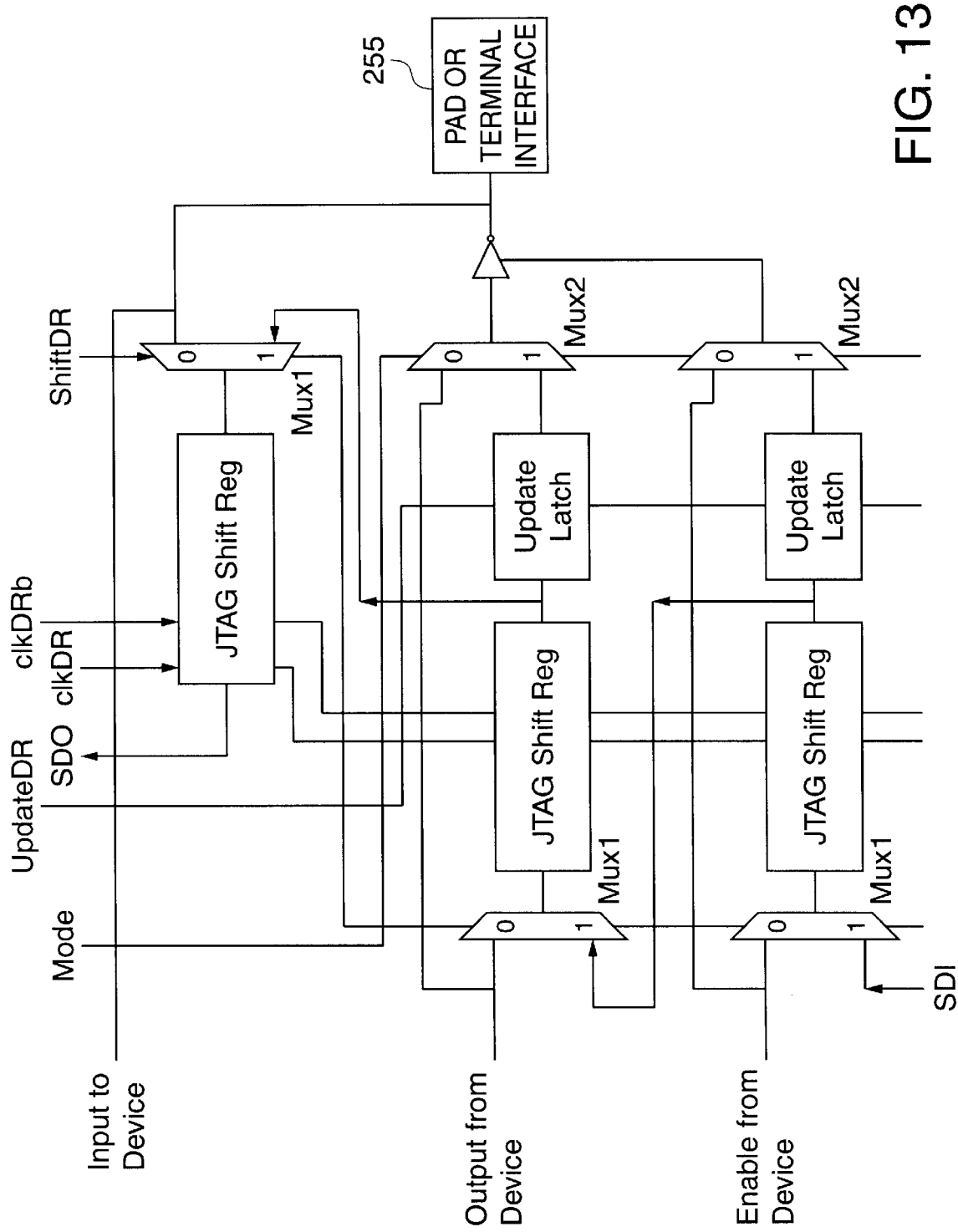
FIG. 13 shows a conventional configuration of JTAG registers in accordance with IEEE standards and that may be used in the present invention.

FIG. 13 shows a configuration for JTAG registers in compliance with IEEE standards and suitable for JTAG blocks 252 or 254. Each JTAG block is associated with a node 255 that can either be an I/O pad for the chip or a terminal in interface 16 between programmable logic 12 and dedicated logic 14. Because there are input/output buffer at the interface between programmable logic 12 and dedicated logic 14, these input/output buffers can be tested along with the input/output buffers about associated with pads at the periphery of the circuit. Thus, a number of JTAG blocks 252 are placed around the periphery of the circuit at the I/O pads in a conventional manner. A second set of JTAG registers 254 are associated with the buffers along the interface 16.

As shown in FIG. 12, demultiplexer 256, which receives the test signal, has two output terminals. One of the output terminals is coupled to the first of the JTAG registers 252 around the periphery, while the second output terminal is coupled to the first of the JTAG registers 254 in interface 16. A select input terminal determines which JTAG registers 252 or 254 receives the test signal. While demultiplexer 256 is shown as off the integrated circuit 10 for the sake of clarity, it should be understood that demultiplexer 256 would normally be part of integrated circuit 250.

Multiplexer 258 has one input terminal coupled to the last JTAG register 254 along interface 16 and another input terminal coupled to the last JTAG register 252 that is on the periphery of programmable logic 12. The output terminal of the multiplexer 258 is coupled to the first JTAG register 252 that is along the periphery of dedicated logic 14. The select input terminal of multiplexer 258 is coupled to the select input terminal of demultiplexer 256. A last JTAG block 253 is coupled to the output terminal for the output test signal OUT.

For testing I/O on the perimeter of chip 250, JTAG circuitry receives a test signal via demultiplexer 256. Demultiplexer 256 provides the test signal to the JTAG registers 252 along the periphery. JTAG blocks 252 pass the signal conventionally from one JTAG block 252 to the next JTAG block 252, until multiplexer 258 receives the test signal. Multiplexer 258 is controlled to pass the test signal across the interface 16. The test signal then continues to pass from one JTAG block 252 to the next until JTAG block 253 outputs the test signal.

Alternatively, for JTAG testing around dedicated logic 254, demultiplexer 256 provides the test signal to a JTAG block 254 along interface 16. JTAG blocks 254 conventionally pass the test signal from one JTAG block 254 to the next, until multiplexer 258 receives the test signal. For this case, multiplexer 258 passes the test signal from the last JTAG block 254 to a JTAG block 252 along the periphery of dedicated logic 14. The test signal passes from one JTAG block 254 to the next until JTAG register 253 receives and outputs the test signal.

Alternative routing of the JTAG test signal is also possible using different routing circuitry in place of demultiplexer 256 and multiplexer 258. For example, the test signal can be routed through JTAG blocks 254 in interface 16 and then around the perimeter of programmable logic 12 or around the entire chip 250

Figure 14A:
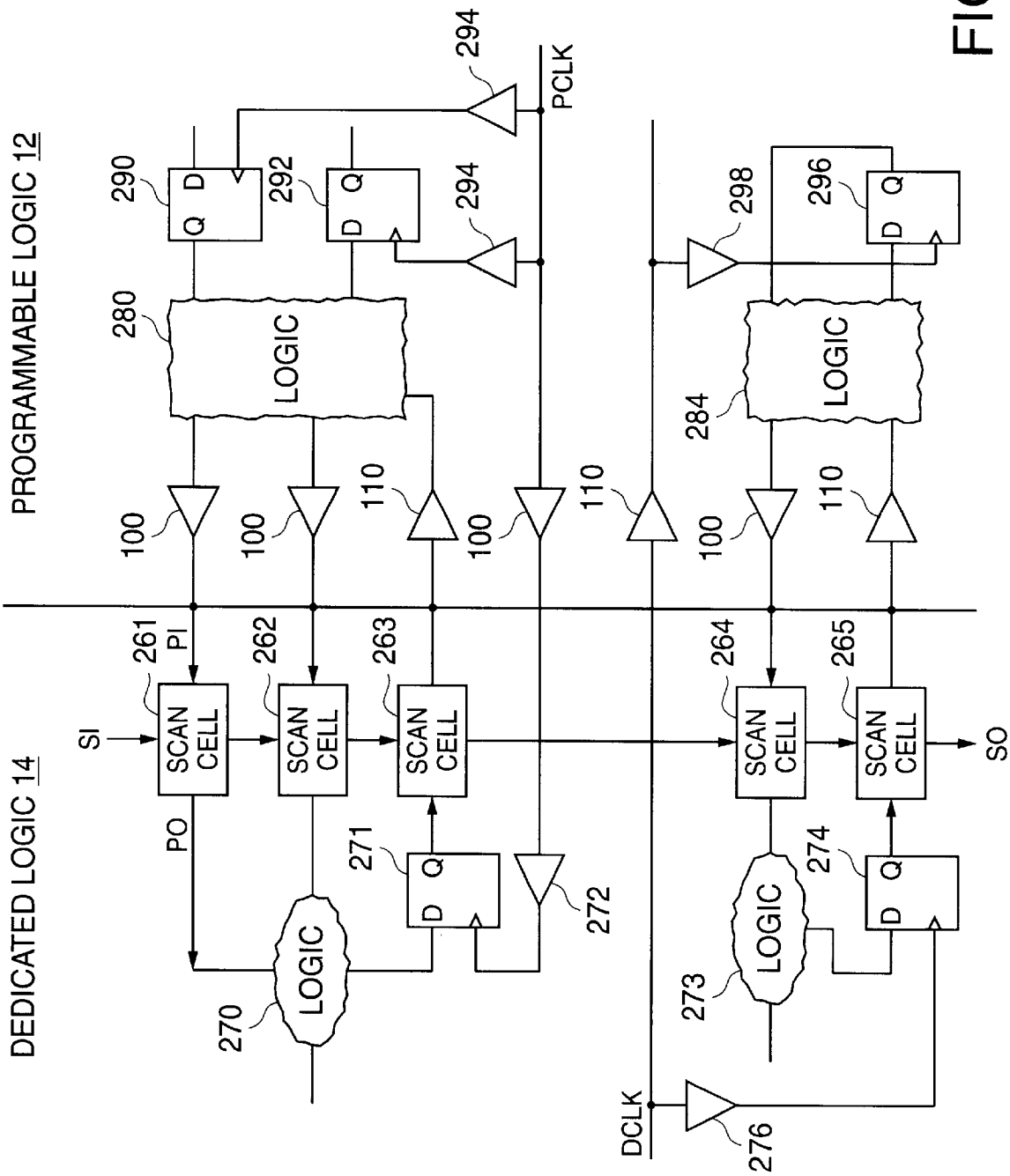
FIGS. 14A and 14B illustrate uses of scan cells for testing at the boundary between the dedicated logic and programmable logic.

FIG. 14A illustrates another embodiment using a test scan along the boundary between dedicated logic 14 and programmable logic 12. In the embodiment of FIG. 14A a series of scan cells 261 to 265 are at the boundary between dedicated logic 14 and programmable logic 12. Scan cells 261 and 262 receive signal from buffers 100 in interface 16. The signals may pass through logic 280 in programmable logic 12 but are synchronized with a clock signal PCLK predominantly used in programmable logic 12. Flip-flops 290 and 292 that receive signal PCLK through clock tree 294 illustrate the synchronization of the signals. During a normal operating mode scan cells 261 and 262 pass the signal from buffer 100 to logic 270 in dedicated logic 14.

Operation of these scan cells in a testing mode is described below in reference to FIG. 15.

Clock signal PCLK from programmable logic 12 passes through a buffer 100 to dedicated logic 14, and a clock tree 272 distributes clock signal PCLK through dedicated logic 14 for signals requiring synchronization to signal PCLK. One such signal is from a flip-flop 271. A scan cell 263 receives that signal and during normal operations, passes that signal to a buffer 110 in interface 16. From there the signal enters logic 280 in programmable logic 12.

Dedicated logic 14 predominantly uses a clock signal DCLK distributed through a clock tree 276. As illustrated, logic 273 in dedicated logic 14 can generate a signal that a flip-flop 274 synchronizes with signal DCLK. During normal operation, a scan cell 265 passes the signal from flip-flop 274 to a buffer 110 in interface 16, and buffer 110 passes the signal to logic 284 in programmable logic 12.

Clock signal DCLK can also be passed to programmable logic 12 via a buffer 110, for signals requiring synchronization with signal PCLK. In FIG. 14A, a flip-flop 296 generates a signal synchronized with signal PCLK that passes through logic 284 and a buffer 100 to a scan cell 264.

Figure 14B:
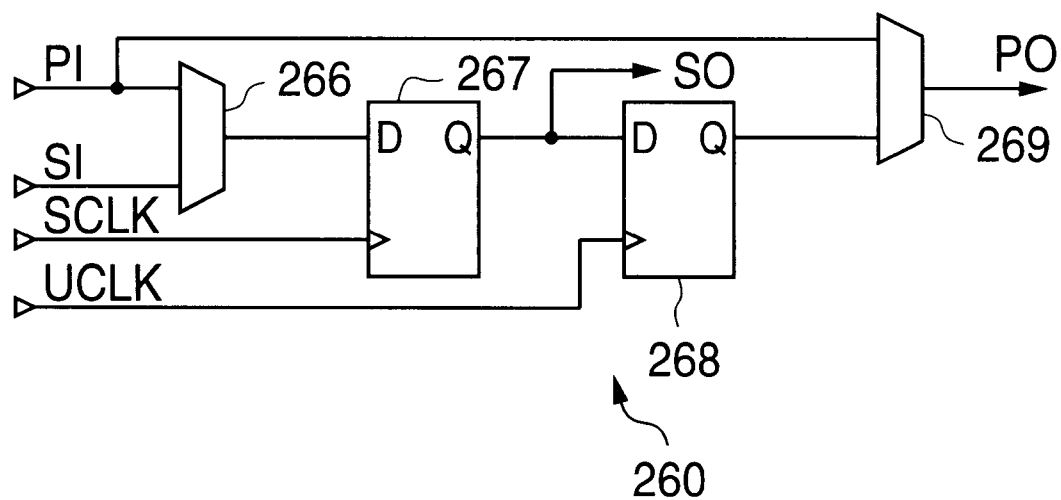

FIG. 14B shows an exemplary embodiment of scan cell 261. Scan cell 261 includes an input multiplexer 266, flip-flops 267 and 268, and an output multiplexer 269. Initially during a test, input multiplexer 266 selects input signal PI which has a value that depends on logic 280. Flip-flop 267 registers the output signal from multiplexer 266 in response to a scan clock signal SCLK and outputs that value for a scan output signal SO. Flip-flop 268 registers the value of signal SO in response to a clock signal UCLK and outputs that value to multiplexer 269. Multiplexer 269 selects the signal from flip-flop 268 during testing. For the test all of the input signals to the IC are known so that proper value for signal PI is known. The value of signal PI is recorded initially in flip-flops 267 and 268.

Scan cells 261 to 265 are connected to each other so that a scan output signal SO from one scan cell is the scan input signal SI for the next scan cell. To read out the scan values in flip-flops 267, the scan clock signal is toggled so that the value from register 267 in one scan cell is recorded in the register 267 in the next cell. Clock signal UCLK is not toggled during this time so that the output from flip-flop 268 and multiplexer 269 remain constant. The output from the last of the scan cells can be connected to an I/O pad so that the binary values from the scan cells can be examined one-by-one at the frequency of the scan clock.

During normal operation, output multiplexer 269 receives and selects input signal PI as the output signal. Accordingly, input signal PI passes through scan cell 261 with very little delay.

Figure 15A:
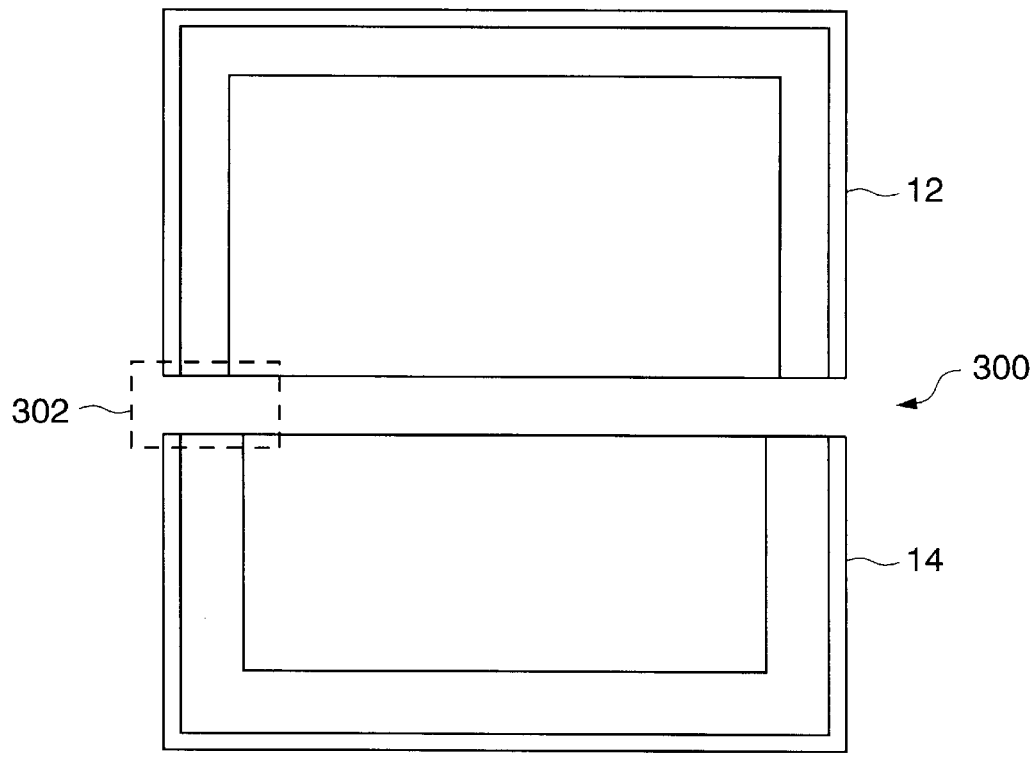
FIGS. 15A and 15B illustrate power supply routing structures in accordance with an embodiment of the invention.

FIG. 15A shows a simplified diagram of programmable logic 12 and dedicated logic 14 in integrated circuit 10 and the power routing structure 300. As can be seen in FIG. 15A, the routing structures for programmable logic 12 and dedicated logic 14 do not necessarily have the same width or pitch. In particular, the I/O buffers and circuitry for programmable logic 12 may differ from the I/O buffers and circuitry for dedicated logic 14. A power bus 302 at the interface couples the power routing structures together.

Figure 15B:
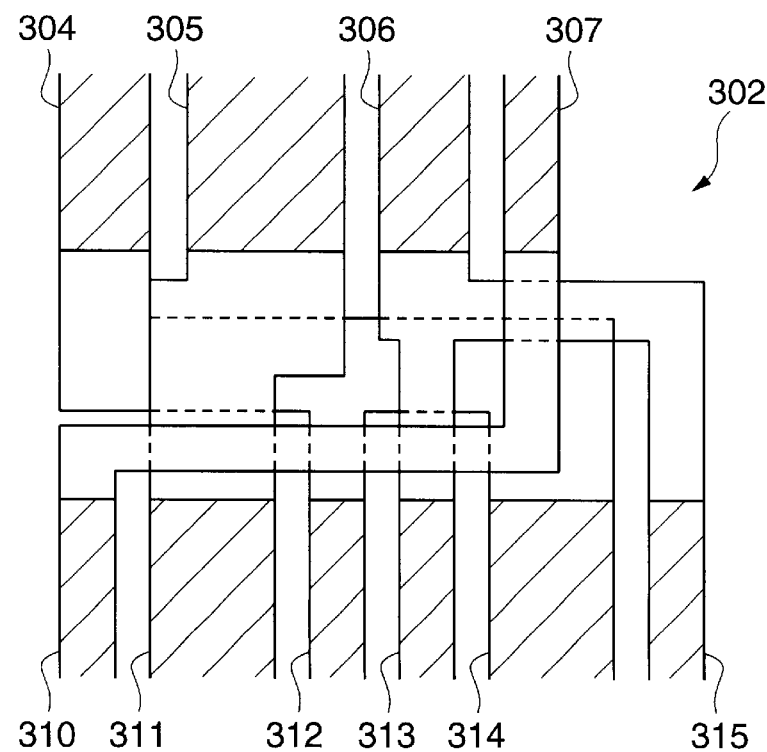

FIG. 15B shows a more detailed diagram of the power bus 302. As can be seen in FIG. 15B, a number of conductors are present on programmable logic 12 side and a different number of conductors are present on the dedicated device side 14. By way of example, conductors 304, 305, 306, and 307 on programmable logic 12 are ground, 3 volts, a second ground, and 5 volts, respectively. The conductors 310, 311, 312, 313, 314, and 315 on dedicated logic 14 are ground, 5 volts, a second ground, 3 volts, a third ground, and a second 3 volts, respectively. Power bus 302 couples the conductors of programmable logic 12 with the appropriate conductors of dedicated logic 14. Thus, for example, the power bus 302 couples conductor 304 to both conductors 312 and 314, conductor 305 couples to conductor 311, conductor 306 couples to conductors 313 and 315, and conductor 307 couples to conductor 310. Thus, a single set of input/output terminals maybe used for powering both programmable logic 12 and dedicated logic 14.

In an exemplary embodiment of the invention, dedicated logic 14 includes a PCI interface and related circuit blocks and programmable logic 12 includes an FPGA. One particular, example of the exemplary embodiment is the soon-to-be available QL5064 from QuickLogic, Inc. The QL5064 Preliminary Data Sheet and the QL5064 User's Manual, Revision 0.98 available from QuickLogic at the time of filing of this patent application describe the QL5064 and are hereby incorporated by reference in their entirety. In this embodiment, programmable logic 12 provides a flexible backend interface that the user can program as required for the user's circuitry. Thus, the user is not restricted to using a fixed interface such as a Power PC interface that may not be optimal for the user's device. However, the dedicated circuit implements the common but complex function of creating a PCI interface, freeing the user of the burden of attempting to create a PCI interface.

Figure 16:
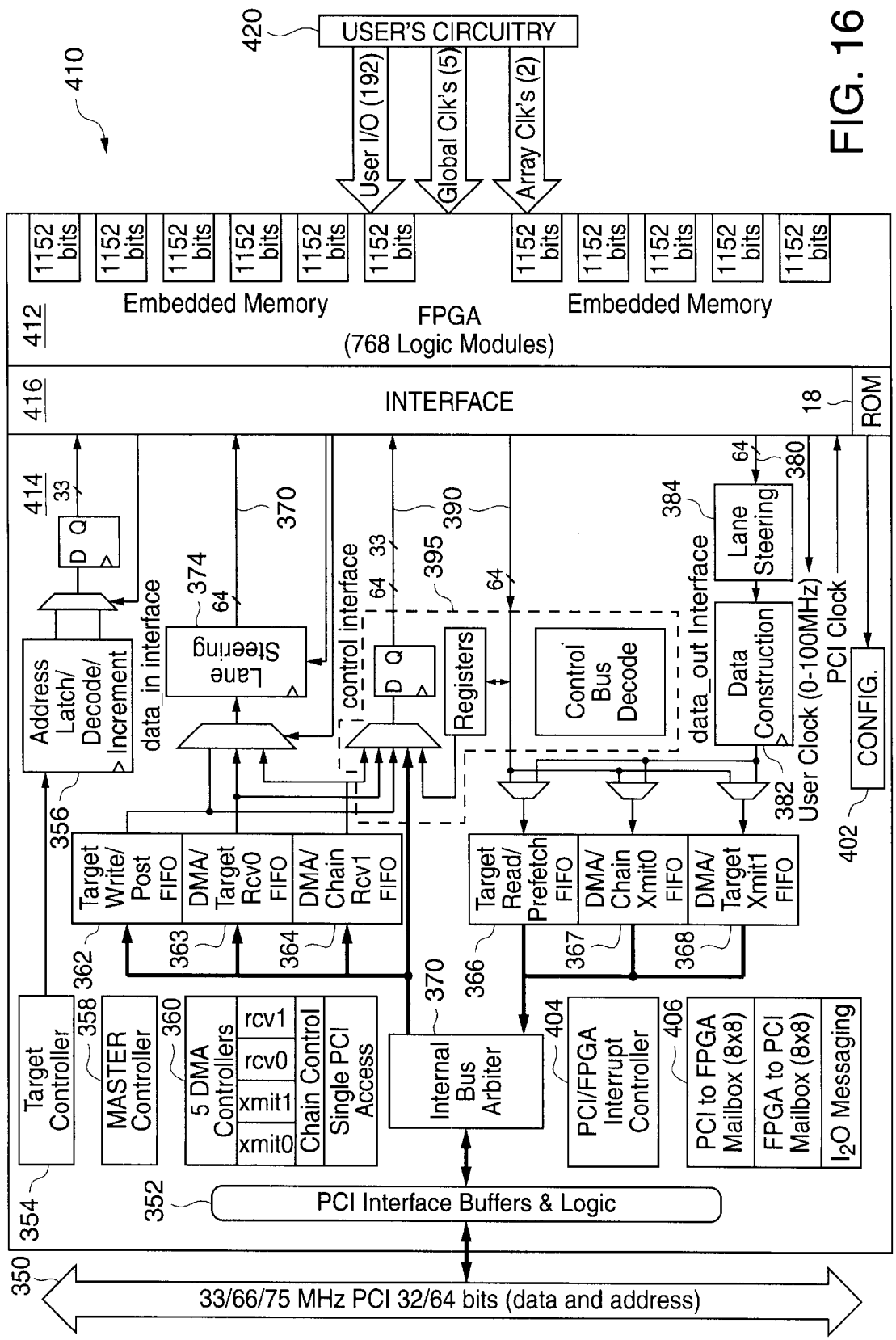
FIG. 16 is a block diagram of an embodiment of the invention in which a dedicated device implements an interface to a PCI bus.

FIG. 16 is a block diagram of a system including an integrated circuit 410 in accordance with an exemplary embodiment of the invention. In the exemplary embodiment, the dedicated logic is a PCI core 414, and the programmable logic is an FPGA. The system of FIG. 16 is a device that attaches to a PCI bus 350 of a host computer. PCI core 414 of IC 410 couples to PCI bus 350, and FPGA 412 couples to user circuitry 420. In an example application, IC 410 and user circuitry 420 are mounted on a printed circuit board that plugs into a slot in the host computer for electrical connection to PCI bus 350 of the host computer. PCI core 414 also acts as a PCI host controller. User circuitry 420 can implement any desired function such as video, sound, communication, or processing, and FPGA 412 can provide a glue-less interface to most 8-bit to 64-bit microprocessors.

PCI core 414 includes PCI interface buffers and logic 352 that connect to PCI bus 350. More particularly, buffers and logic 352 couple to I/O pins of IC 410 for receipt and transmission of signals that the PCI standard defines. To implement the PCI protocols, PCI core 414 further includes a target controller 354 and a master controller 358. An interrupt controller 404 controls interrupt signals on PCI bus 350, and a communication block 406 implements PCI communications not requiring buffers. In particular, communications block 406 includes mailbox registers for transfer of single datum up to 64 bits in length, and circuitry for implementing the I$_2$O standard for communication of PCI devices. A configuration block 402 that uses configuration data from PROM 18 determines the configuration parameters of PCI core 414.

Five DMA controllers 360 control direct memory access operations that transfer data from the main memory or a device on PCI bus 350 to FIFO buffers 362, 363, and 364 and from FIFO buffers 366, 367, and 368 to the main memory or a device on PCI bus 350. In the exemplary embodiment, each buffer 362 to 364 and 366 to 368 is at least 72 bits wide, including 64 bits for data and eight bits for byte enables. FIFO buffer 362 is a "target write buffer"

or post-fetch buffer and is about 32 quadwords deep. FIFO buffers 363 and 364 are master receive buffers and about 64 quadwords deep to support sustained burst transfers. FIFO buffer 366 is a "target read buffer" or pre-fetch buffer and about 16 quadwords deep. FIFO buffers 367 and 368 are master transmit buffers and about 64 quadwords deep to support sustained burst transfers.

Data from FIFO buffers 362, 363, and 364 flow into FPGA 412 via a one-way bus 370 and a bi-directional bus 390. Data from FPGA 412 flows into FIFO buffers 366, 367, and 368 via a one-way bus 380 and a bi-directional bus 390. A lane steering circuit 374 is between FIFO buffers 362 to 364 and bus 370. Lane steering circuit 374 includes a barrel shifter that permits aligning received 64-bit data on any byte. Similarly, lane steering circuit 384 and data construction unit 382 are between bus 380 and FIFO buffers 366 to 368. Lane steering circuit 384 can re-align 64-bit data from FPGA 412, and data construction unit 382 can construct 64-bit aligned data using bytes from two consecutive data values from FPGA 412. Bi-directional bus 390 has a control interface 395 that selects data transfer either from FIFO buffers 362 to 364 or from buffers and logic 352.

Buffers and interface 352 receive a bus clock signal PCI_CLK (typically at frequency 66 MHz) for synchronous communication via PCI bus 350. PCI core 414 uses clock signal PCI_CLK for synchronous data transfer and also passes clock signal PCI_CLX via interface 416 to FPGA 412. FPGA 412 also has a separate user clock signal USER_CLK that is for data transfer to user circuitry 420 but is typically not synchronized with clock signal PCI_CLK. FIFO buffers 362 to 364 and 366 to 368 allows data transfers across clock domains in IC 410. In the exemplary embodiment, clock signal USER_CLK can have a frequency of up to 100 MHz. However, PCI devices often use clock signals that are lower than the clock frequency for the PCI bus. When the frequency of clock signal USER_CLK is less than the frequency of clock signal PCI_CLK, IC 410 can still use the full PCI data bandwidth in transfers between PCI core 414 and FPGA 412 because IC 410 has multiple 64-bit buses running between PCI core 414 and FPGA 412. In particular, with three buses as shown in FIG. 16, clock signal USER_CLK can have a frequency as low as 22 MHz and still use the entire data bandwidth of the 66-MHz PCI bus 350. Further, incorporating PCI core 414 and FPGA 412 on the same IC 410 allows a large number of data lines without having an I/O pin for each data line as would be required if PCI core 414 and FPGA 414 were separate IC devices.

Design of integrated circuits such as IC 410 of FIG. 16 commonly requires simulations to determine the delays and timing of circuit components. In particular, synchronous circuits require that the circuitry between clocked registers or latches be fast enough to complete a required logic operation within a clock cycle. Circuits such as IC 410 present a challenge to currently available circuit simulation software because the wiring and actual logic implemented in FPGA 412 is unknown until the user programs FPGA 412. This makes simulation of dedicated logic 414 difficult because dedicated logic 414 receives signals from and sends signals to FPGA 412.

One simulation method simply uses the driver strengths from FPGA 412 as parameters to the simulation of dedicated logic 414. However, when this is done current simulation software ignore the conductive interconnect length between the driver in interface 416 and the first logic element in dedicated logic 414. As IC fabrication techniques achieve smaller dimensions, the affect of the interconnect lengths become critical for accurate simulation of dedicated logic 414. In particular, for interconnects that are 0.35 microns or smaller, the interconnects become a significant delay.

Figure 17:
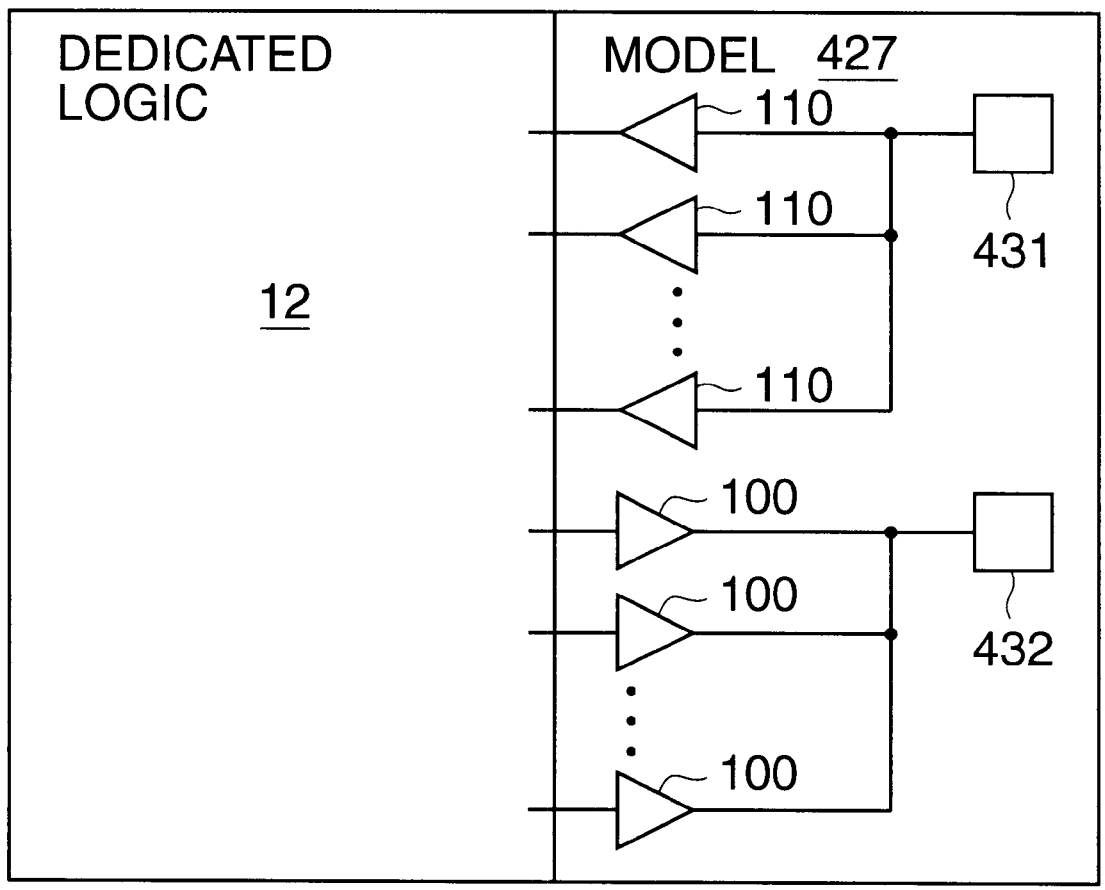
FIG. 17 shows an embodiment of a model for progammable logic for use with dedicated logic.

According to an aspect of the invention, a simple model for the FPGA 412 permits current simulation software such as the Synopsis Design compiler to adequately account for the FPGA 412 when simulating PCI core 414. FIG. 17 shows an embodiment of a model 422 for programmable logic for uses with dedicated logic 12. The model 422 of the programmable logic includes an I/O (input) pad 431 coupled to buffers 110 and I/O pad (output) 432 coupled to buffers 100. Buffers 100 and 110 are modeled correctly according to the actual drive strengths to be used. In the simulation, pads have pin capacitance and a slew vs. capacitance table in the model. The simulation can ignore the actual circuitry used in the programmable logic, which is unpredictable before programming, and lead length between the buffers and the pads. However, the conventional software does correctly consider the interconnect length between buffers 100 and 110 and dedicated logic 12.

Although the present invention is described in connection with certain specific embodiments for instructional purposes, the present invention is not limited thereto. The depictions of the various structures in the various diagrams are illustrative. Aspects of the present invention are not limited to amorphous silicon antifuses and oxide-nitride-oxide antifuses, but rather extend to other antifuse structures. Further, it is should be understood that conductive routing resources can be made of any suitable conductive material or combination of materials and need not be made of metal. Accordingly, various modifications, adaptations, and combinations of various features of the described embodiments can be practiced without departing from the scope of the invention as defined in the following claims.

What is claimed is:

1. An apparatus comprising:
   programmable logic;
   a dedicated device and an interface disposed between said dedicated device and said programmable logic, said interface comprising an array of programmable antifuses.

2. The apparatus of claim 1, said interface further comprises a plurality of interface buffers, said interface buffers coupled to said array of programmable antifuses.

3. The apparatus of claim 1, further comprising a configurable non–volatile memory coupled to said dedicated device.

4. The apparatus of claim 1, wherein said programmable logic is a field programmable gate array.

5. The apparatus of claim 1, further comprising a second dedicated device, said interface being disposed between said second dedicated device and said programmable logic, wherein said dedicated device and said second dedicated device are independently operable.

6. An integrated circuit including programmable logic interfaced with a dedicated device, said apparatus comprising:
   a first clock circuit within said programmable logic;
   a second clock circuit within said dedicated device;
   a plurality of pads that receive clock signals, said pads are coupled to said first clock circuit by a plurality of routing resources, at least one of said plurality of pads is coupled to said second clock circuit and said first clock circuit.

7. The integrated circuit of claim 6, said integrated circuit having four sides, wherein said plurality of pads comprises a first number of pads and a second number of pads, said first number of pads and said second number of pads are on opposing sides of said integrated circuit.

8. The integrated circuit of claim 7, wherein said first number of pads are on a side of said integrated circuit closest to said programmable logic and said second number of pads are on the side of said integrated circuit closest to said dedicated device.

9. The integrated circuit of claim 8, wherein said at least one of said plurality of pads coupled to said second clock circuit is located on said second side.

10. An apparatus comprising programmable logic coupled to a dedicated device by an interface, said interface comprising:
  a plurality of first conductors from said programmable logic to said dedicated device;
  a plurality of second conductors from said dedicated device to said programmable logic;
  buffers coupled to said first conductors and said second conductors;
  a testing circuit coupled to each buffer, said testing circuit comprising:
    a PMOS test transistor having a first terminal coupled to a voltage source, a second terminal coupled to an first output terminal, and a gate terminal coupled to the output terminal of said buffer;
    an NMOS test transistor having a first terminal coupled to a ground source, a second terminal, and a gate terminal coupled to the output terminal of said buffer;
  a weak detection circuit coupled to said testing circuit, said weak detection circuit comprising:
    a first inverter including a first PMOS transistor and a first NMOS transistor, said first inverter having an input terminal and an output terminal, said input terminal coupled to a voltage source, and said output terminal coupled to said second terminal of said PMOS test transistor, said PMOS test transistor being larger than said first NMOS transistor in said first inverter;
    a second inverter including a second PMOS transistor and a second NMOS transistor, said second inverter having an input terminal and an output terminal, said input terminal coupled to a ground source, and said output terminal coupled to said second terminal of said NMOS test transistor, said NMOS test transistor being larger than said first PMOS transistor in said second inverter.

11. The apparatus of claim 10, wherein a plurality of testing circuits are coupled to said weak detection circuit, said output terminal of said first inverter being coupled to each second terminal of said PMOS test transistors and said output terminal of said second inverter being coupled to each second terminal of said NMOS test transistors.

12. The apparatus of claim 10, said apparatus further comprising a configurable non-volatile memory, said interface further comprising:
  a plurality of third conductors from said configurable non-volatile memory to said dedicated device;
  wherein said buffers are coupled to said first conductors, said second conductors, and third conductors.

13. An apparatus comprising programmable logic coupled to a dedicated device by an interface, said apparatus having a first side on one side of said interface and a second side on the opposing side of said interface, said apparatus comprising:
  a first set of peripheral input/output terminals around the periphery of said first side;
  a second set of peripheral input/output terminals around the periphery of said second side;
  a set of interface input/output terminals between said programmable logic and said dedicated device;
  a first set of JTAG registers coupled to said first set of peripheral input/output terminals;
  a second set of JTAG registers coupled to said second set of peripheral input/output terminals;
  a third set of JTAG registers coupled to said interface input/output terminals;
  a demultiplexer having an input terminal receiving a test signal, a select terminal, a first output terminal coupled to said first set of JTAG registers, and a second output terminal coupled to said third set of JTAG registers; and
  a multiplexer having a select terminal, a first input terminal coupled to said first set of JTAG registers, a second input terminal coupled to said third set of JTAG registers, and an output terminal coupled to said second set of JTAG registers.

* * * * *